(12) United States Patent
Katsuta

(10) Patent No.: US 12,367,847 B2
(45) Date of Patent: Jul. 22, 2025

(54) DISPLAY DEVICE

(71) Applicant: Japan Display Inc., Tokyo (JP)

(72) Inventor: Tadayoshi Katsuta, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/771,564

(22) Filed: Jul. 12, 2024

(65) Prior Publication Data

US 2025/0029572 A1 Jan. 23, 2025

(30) Foreign Application Priority Data

Jul. 20, 2023 (JP) .................................. 2023-118665

(51) Int. Cl.

| | |
|---|---|
| *G09G 5/00* | (2006.01) |
| *G09G 3/36* | (2006.01) |
| *G11C 19/28* | (2006.01) |
| *H10D 86/40* | (2025.01) |
| *H10D 86/60* | (2025.01) |
| *G02F 1/1362* | (2006.01) |
| *G02F 1/1368* | (2006.01) |

(52) U.S. Cl.
CPC ......... *G09G 3/3677* (2013.01); *G11C 19/287* (2013.01); *H10D 86/441* (2025.01); *H10D 86/60* (2025.01); *G02F 1/136286* (2013.01); *G02F 1/1368* (2013.01); *G09G 2310/0286* (2013.01)

(58) Field of Classification Search
CPC .. G09G 3/3648; G09G 3/3666; G09G 3/3677; G09G 2310/0286; G02F 1/136286; G02F 1/1368; G11C 19/28; G11C 19/287
See application file for complete search history.

(56) References Cited

U.S. PATENT DOCUMENTS

| | | | | |
|---|---|---|---|---|
| 6,166,726 | A * | 12/2000 | Uchida ................ | G09G 3/3696 345/204 |
| 6,300,797 | B1* | 10/2001 | Koizumi .............. | G09G 3/3674 326/88 |
| 10,354,571 | B2* | 7/2019 | Tashiro .................. | G09G 3/006 |
| 12,170,063 | B2* | 12/2024 | Chen .................... | G09G 3/3233 |
| 2002/0044127 | A1 | 4/2002 | Uchino et al. | |
| 2007/0040789 | A1* | 2/2007 | Ha ....................... | G09G 3/3677 345/98 |
| 2007/0268059 | A1* | 11/2007 | Sakaguchi ....... | H03K 19/00315 327/333 |
| 2012/0218245 | A1* | 8/2012 | Morii ................... | G09G 3/3677 345/87 |
| 2024/0062733 | A1* | 2/2024 | Katsuta ............... | G09G 3/3696 |
| 2024/0062734 | A1* | 2/2024 | Katsuta .................... | G09G 3/36 |
| 2024/0063231 | A1* | 2/2024 | Katsuta ............... | H10D 86/441 |

FOREIGN PATENT DOCUMENTS

| | | |
|---|---|---|
| JP | 2001-356738 A | 12/2001 |
| JP | 2002-023683 A | 1/2002 |

* cited by examiner

*Primary Examiner* — Joe H Cheng
(74) *Attorney, Agent, or Firm* — K&L Gates LLP

(57) ABSTRACT

A display device includes a substrate having a display region in which a plurality of pixels are arrayed in a first direction and a second direction different from the first direction, a plurality of scanning lines coupled to the pixels arrayed in the first direction, a plurality of signal lines coupled to the pixels arrayed in the second direction, a gate driver configured to supply a scanning signal to the scanning lines, and a signal line selection circuit configured to supply a pixel signal to the signal lines.

3 Claims, 17 Drawing Sheets

DISPLAY DEVICE

CROSS-REFERENCE TO RELATED APPLICATION

This application claims the benefit of priority from Japanese Patent Application No. 2023-118665 filed on Jul. 20, 2023, the entire contents of which are incorporated herein by reference.

BACKGROUND

1. Technical Field

The present disclosure relates to a display device.

2. Description of the Related Art

There has recently been a demand for display panels with higher definition for a configuration that magnifies a display image by a lens, such as virtual reality (VR), augmented reality (AR), and mixed reality (MR). To provide display panels with higher definition, it is required to secure the charging time of pixels.

To secure the time for writing video signals to the pixels on a scanning end side in a conventional active matrix liquid crystal display device with a dot-sequential driving system, a configuration is disclosed in which the writing time for the pixels on the scanning end side is delayed by approximately ½H (e.g., Japanese Patent Application Laid-open Publication No. 2002-023683 (JP-A-2002-023683)). To secure the charging time of the pixels in a high-resolution active matrix liquid crystal display device, a configuration is disclosed in which a logical sum signal of an output signal of a shift register and a signal obtained by delaying the output signal by 1H is supplied as a scanning signal, and a display data signal is supplied in the latter 1H period of the scanning signal (e.g., Japanese Patent Application Laid-open Publication No. 2001-356738 (JP-A-2001-356738)).

In the technology disclosed in JP-A-2002-023683, it is necessary to provide vertical drive circuits on both left and right sides of the pixel unit. In the technology disclosed in JP-A-2001-356738, it is necessary to provide a delay circuit and an OR circuit to each scanning signal line. Thus, the conventional technologies described above may possibly increase the circuit scale for driving the scanning lines.

An object of the present disclosure is to provide a display device with higher definition.

SUMMARY

A display device according to an embodiment of the present disclosure includes a substrate having a display region in which a plurality of pixels are arrayed in a first direction and a second direction different from the first direction, a plurality of scanning lines coupled to the pixels arrayed in the first direction, a plurality of signal lines coupled to the pixels arrayed in the second direction, a gate driver configured to supply a scanning signal to the scanning lines, and a signal line selection circuit configured to supply a pixel signal to the signal lines. The gate driver includes a shift register circuit comprising a plurality of register circuits cascaded in descending or ascending order in the second direction, the register circuits being configured to output a binary signal that maintains a high potential of an input signal at a rising edge of a shift clock signal until a falling edge of the shift clock signal, and a plurality of output circuits provided corresponding to the respective register circuits, the output circuits each include Q AND circuits configured to generate a logical product of an output signal of the register circuit and an enable signal as a logical value of the scanning signal, the register circuits each receive the shift clock signal that is at a high potential for Q+1 horizontal periods in descending or ascending order in a manner shifted by Q horizontal periods, and the AND circuits each receive the enable signal that is at a high potential for two horizontal periods in descending or ascending order in a manner shifted by one horizontal period.

A display device according to an embodiment of the present disclosure includes a substrate having a display region in which a plurality of pixels are arrayed in a first direction and a second direction different from the first direction, a plurality of scanning lines coupled to the pixels arrayed in the first direction, a plurality of signal lines coupled to the pixels arrayed in the second direction, a gate driver configured to supply a scanning signal to the scanning lines, and a signal line selection circuit configured to supply a pixel signal to the signal lines. The gate driver includes a shift register circuit comprising a plurality of register circuits cascaded in descending or ascending order in the second direction, the register circuits being configured to output a binary signal that maintains a high potential of an input signal at a falling edge of a shift clock signal until a rising edge of the shift clock signal, and a plurality of output circuits provided corresponding to the respective register circuits, the output circuits each include Q AND circuits configured to generate a logical product of an output signal of the register circuit and an enable signal as a logical value of the scanning signal, the register circuits each receive the shift clock signal that is at a low potential for Q+1 horizontal periods in descending or ascending order in a manner shifted by Q horizontal periods, and the AND circuits each receive the enable signal that is at a high potential for two horizontal periods in descending or ascending order in a manner shifted by one horizontal period.

DETAILED DESCRIPTION

Figure 1:
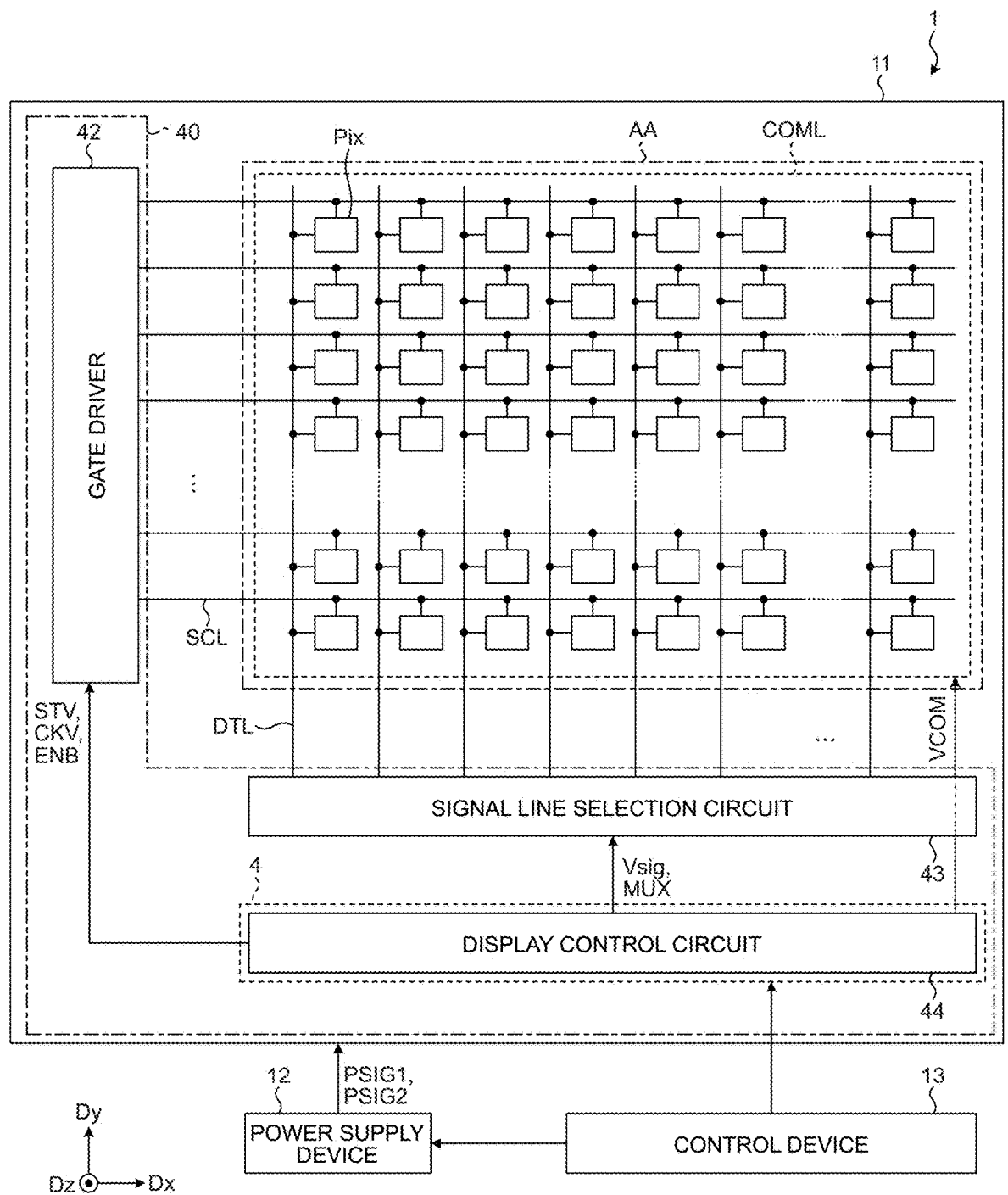
FIG. 1 is a diagram of an example of a schematic configuration of a display device.

Exemplary aspects (embodiments) to embody the present disclosure are described below in greater detail with reference to the accompanying drawings. The contents described in the embodiments below are not intended to limit the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the drawings, components similar to those previously described with reference to previous drawings are denoted by like reference numerals, and detailed explanation thereof may be appropriately omitted.

Figure 2:
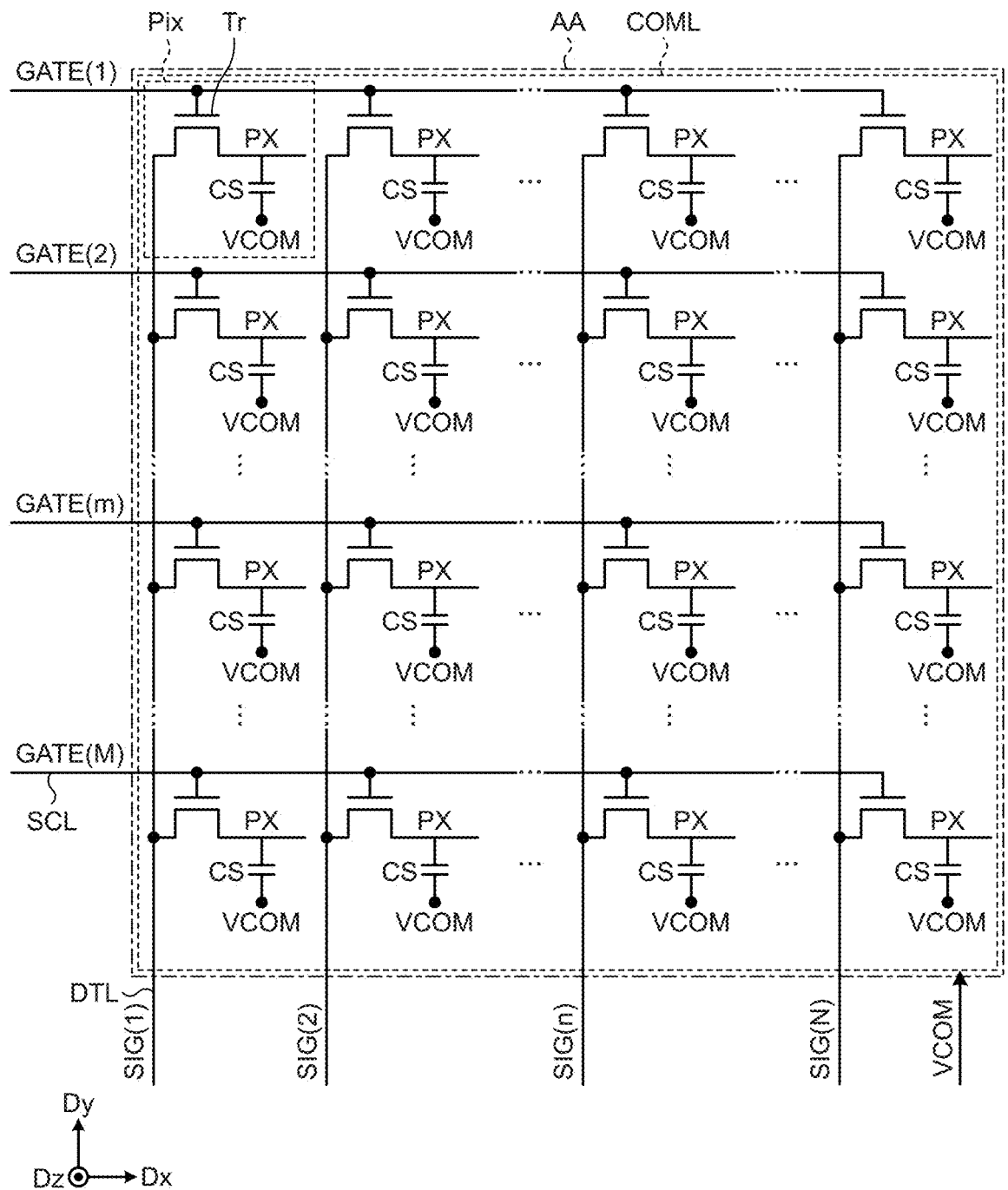
FIG. 2 is a diagram of an example of a pixel array in a display region.

FIG. 1 is a diagram of an example of a schematic configuration of a display device. FIG. 2 is a diagram of an example of a pixel array in a display region.

A display device 1 according to the present embodiment is a liquid crystal display device provided with liquid crystal display elements as display elements, for example. The display device 1 according to the present disclosure can employ a column inversion driving method or a frame inversion driving method, for example, as a driving method. The driving method in the display device 1 is not limited to the column inversion driving method or the frame inversion driving method.

The display device 1 has a display region AA on a display panel 11 and is provided with a drive circuit 40 in a peripheral region of the display region AA. The display device 1 is supplied with electric power from a power supply device 12.

The drive circuit 40 includes a gate driver 42, a signal line selection circuit 43, and a display control circuit 44. The gate driver 42 and the signal line selection circuit 43 are thin-film transistor (TFT) circuits formed in the peripheral region of the display region AA. The display control circuit 44 is included in a driver IC 4 mounted on the peripheral region of the display region AA. The driver IC 4 is coupled to a control device 13 via a relay substrate composed of flexible printed circuits (FPC), for example.

The control device 13 controls power supply from the power supply device 12 to the display device 1. The control device 13 also controls turning-on and -off of the display device 1. The power supply device 12 and the control device 13 are mounted on a device (not illustrated) on which the display device 1 is mounted, for example.

The display region AA is provided with a plurality of pixels Pix aligned in a Dx direction (first direction) and a Dy direction (second direction). The display region AA is also provided with scanning lines (gate lines) SCL, signal lines DTL, and a common electrode COML. The scanning line SCL supplies scanning signals (gate signals) GATE to the pixels Pix. The signal line DTL supplies pixel signals SIG to the pixels Pix. The common electrode COML supplies a common potential VCOM to the pixels Pix. The scanning line SCL according to the present embodiment extends in the Dx direction (first direction). The signal line DTL according to the present embodiment extends in the Dy direction (second direction).

As illustrated in FIG. 2, the pixels Pix each include a pixel transistor Tr and a pixel electrode PX. The pixel transistor Tr is composed of a thin-film transistor (TFT) and is composed of, for example, an n-channel metal oxide semiconductor (MOS) TFT (hereinafter also referred to as "n-type TFT"). The source of the pixel transistor Tr is coupled to the signal line DTL, the gate thereof is coupled to the scanning line (gate line) SCL, and the drain thereof is coupled to the pixel electrode PX. A holding capacitance CS is formed between the pixel electrode PX and the common electrode COML.

The gates of the pixel transistors Tr of the pixel Pix arrayed in the Dx direction (first direction) are supplied with the scanning signals (gate signals) GATE (1, 2, . . . , m, . . . , and M) via the scanning lines (gate lines) SCL. The sources of the pixel transistors Tr of the pixels Pix arrayed in the Dy direction (second direction) are supplied with the pixel signals SIG (1, 2, . . . , n, . . . , and N) via the signal lines DTL. While N pixels Pix are arrayed in the Dx direction (first direction), and M pixels Pix are arrayed in the Dy direction (second direction) in the example illustrated in FIG. 2, the present disclosure is not limited thereto. In the following description, the row in which the pixels Pix are arrayed in the Dx direction (first direction) is also referred to as a pixel row. The column in which the pixels Pix are arrayed in the Dy direction (second direction) is also referred to as a pixel column.

The pixels Pix according to the present disclosure include, for example, red pixels for displaying red (R), green pixels for displaying green (G), and blue pixels for displaying blue (B). While the pixel array is a stripe array in which RGB pixels are arrayed in the Dx direction (first direction), for example, it is not limited to the RGB stripe array. Specifically, for example, white pixels for displaying white (W) may be provided as the pixels Pix. Alternatively, a diagonal stripe array having a predetermined angle to the Dx direction (first direction) or the Dy direction (second direction) may be employed. Still alternatively, a plurality of pixel groups that display different colors may be periodically arranged in both the Dx direction (first direction) and the Dy direction (second direction).

The power supply device 12 generates a positive first power supply voltage signal PSIG1 and a negative second power supply voltage signal PSIG2 to be supplied to the display device 1. The first power supply voltage signal PSIG1 is controlled at a first potential (VGH). The second power supply voltage signal PSIG2 is controlled at a second potential (VGL) lower than the first potential (VGH). The first potential (VGH) is set to 6 V, for example. The second potential (VGL) is set to −6 V, for example. The first potential (VGH) is not limited to 6 V. The second potential (VGL) is not limited to −6 V.

The control device 13 transmits video signals serving as the original signals of video to be displayed on the display device 1 to the display device 1. The control device 13 also transmits control signals to the display device 1 to control the display device 1. The control device 13 also transmits control signals to the power supply device 12 to control power supply from the power supply device 12 to the display device 1.

The control device 13 includes, for example, a central processing unit (CPU) and a storage device, such as a memory. The control device 13 can implement display functions of the display device 1 by executing computer programs using these hardware resources, such as the CPU and the storage device. The control device 13 performs control such that the driver IC 4 can handle an image to be displayed on the display device 1 as image input gradation information according to the execution results of the computer programs.

The display control circuit 44 controls the display operation in the display region AA by controlling the gate driver 42 and the signal line selection circuit 43. The display control circuit 44 receives video signals and various control signals from the control device 13. The display control circuit 44 converts the video signals received from the control device 13 into image signals Vsig and outputs them. The image signal Vsig is a signal obtained by time-division multiplexing the pixel signal SIG according to the RGB pixel array, for example. The display control circuit 44 also supplies the common potential VCOM to the common electrode COML.

The display control circuit 44 also functions as an interface (I/F) and a timing generator between the signal line selection circuit 43 and the control device 13.

Figure 3:
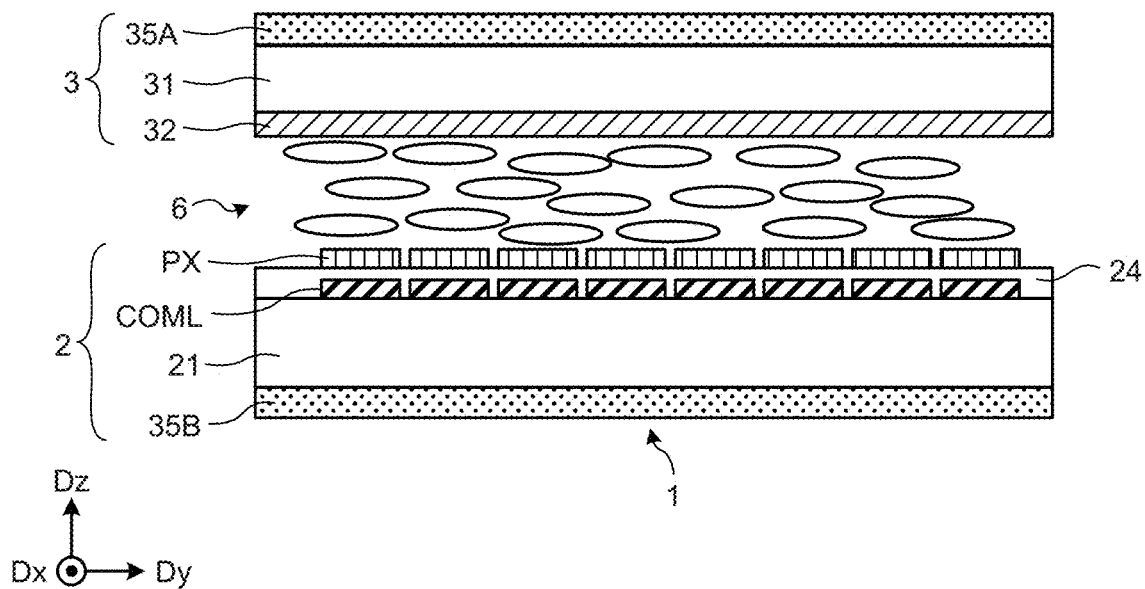
FIG. 3 is a sectional view of a schematic sectional structure of the display device.
Figure 4:
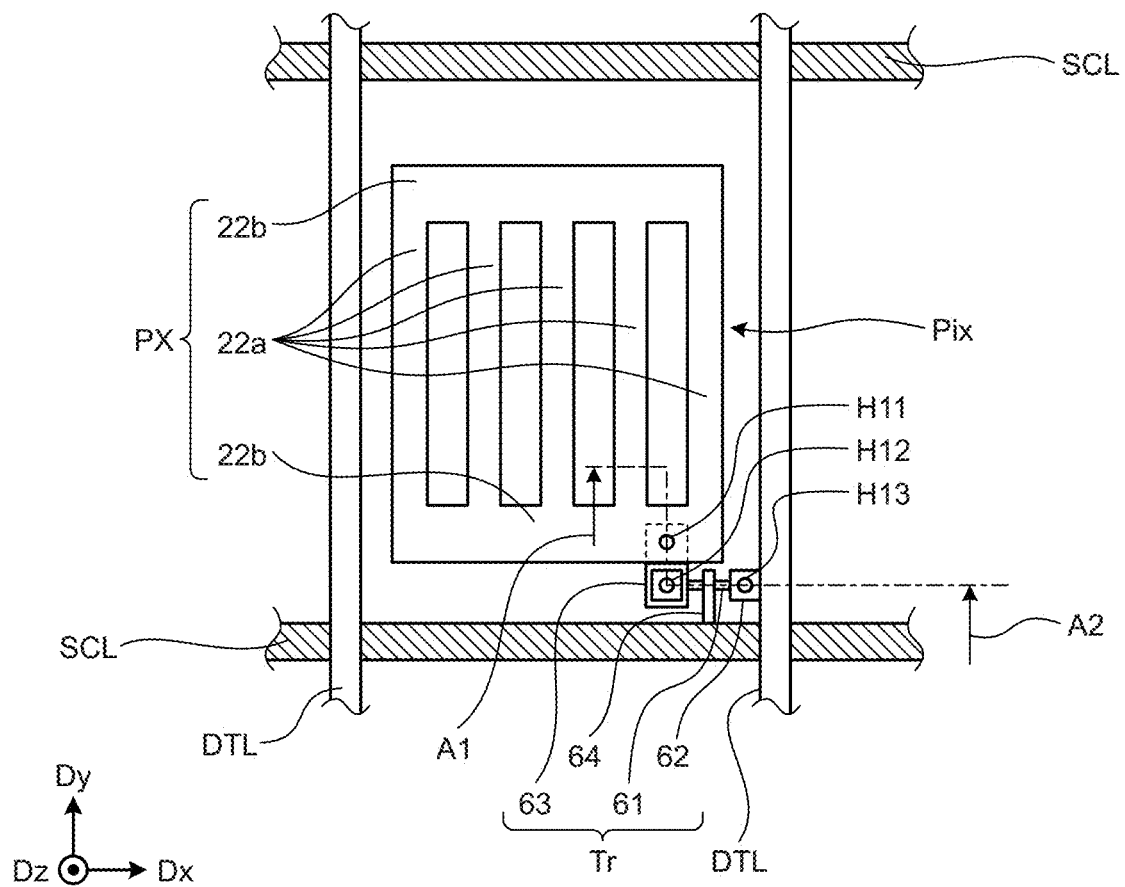
FIG. 4 is a plan view of an exemplary configuration of a pixel.
Figure 5A:
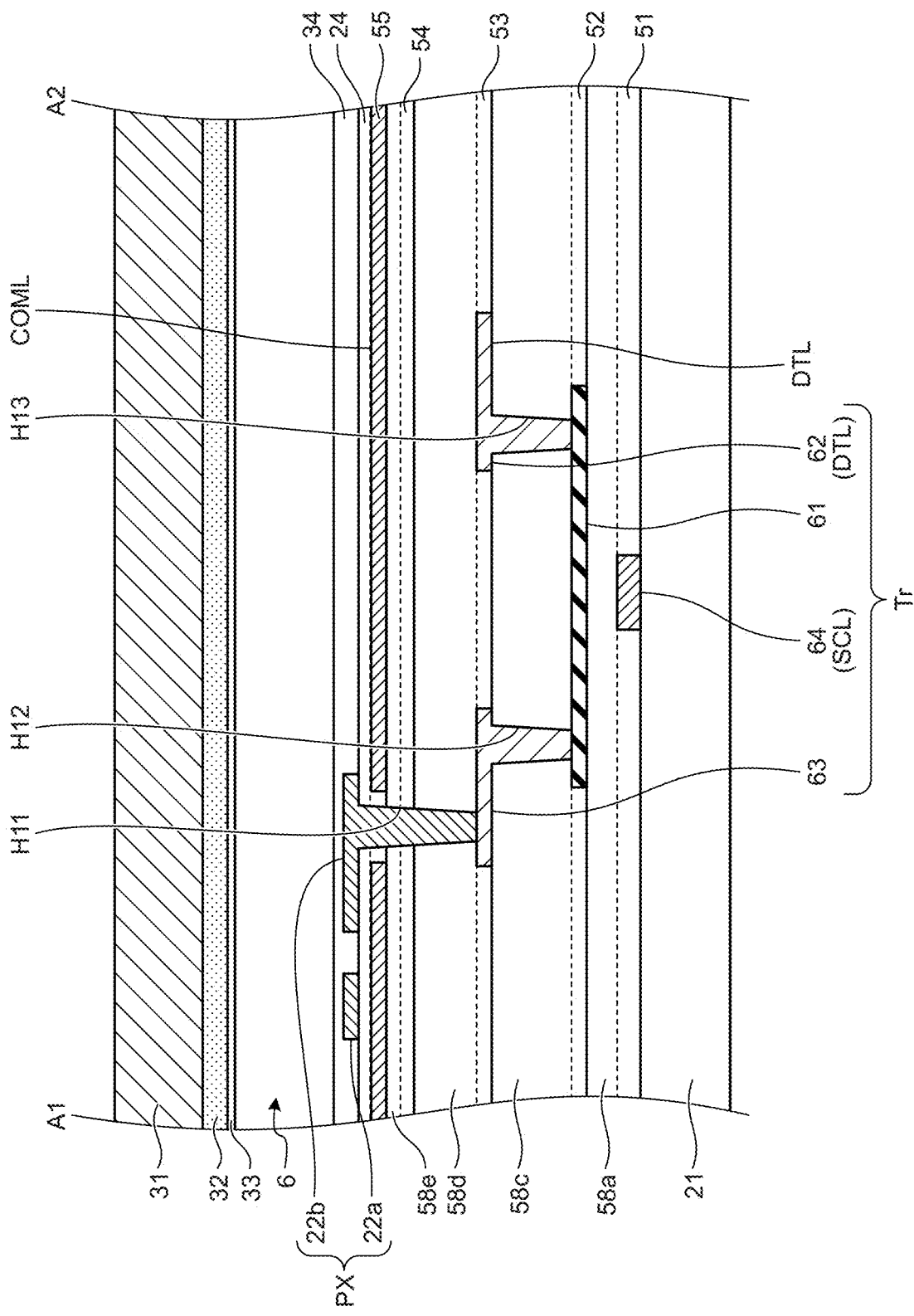
FIG. 5A is a schematic of a first example of a section along line A1-A2 of FIG. 4.
Figure 5B:
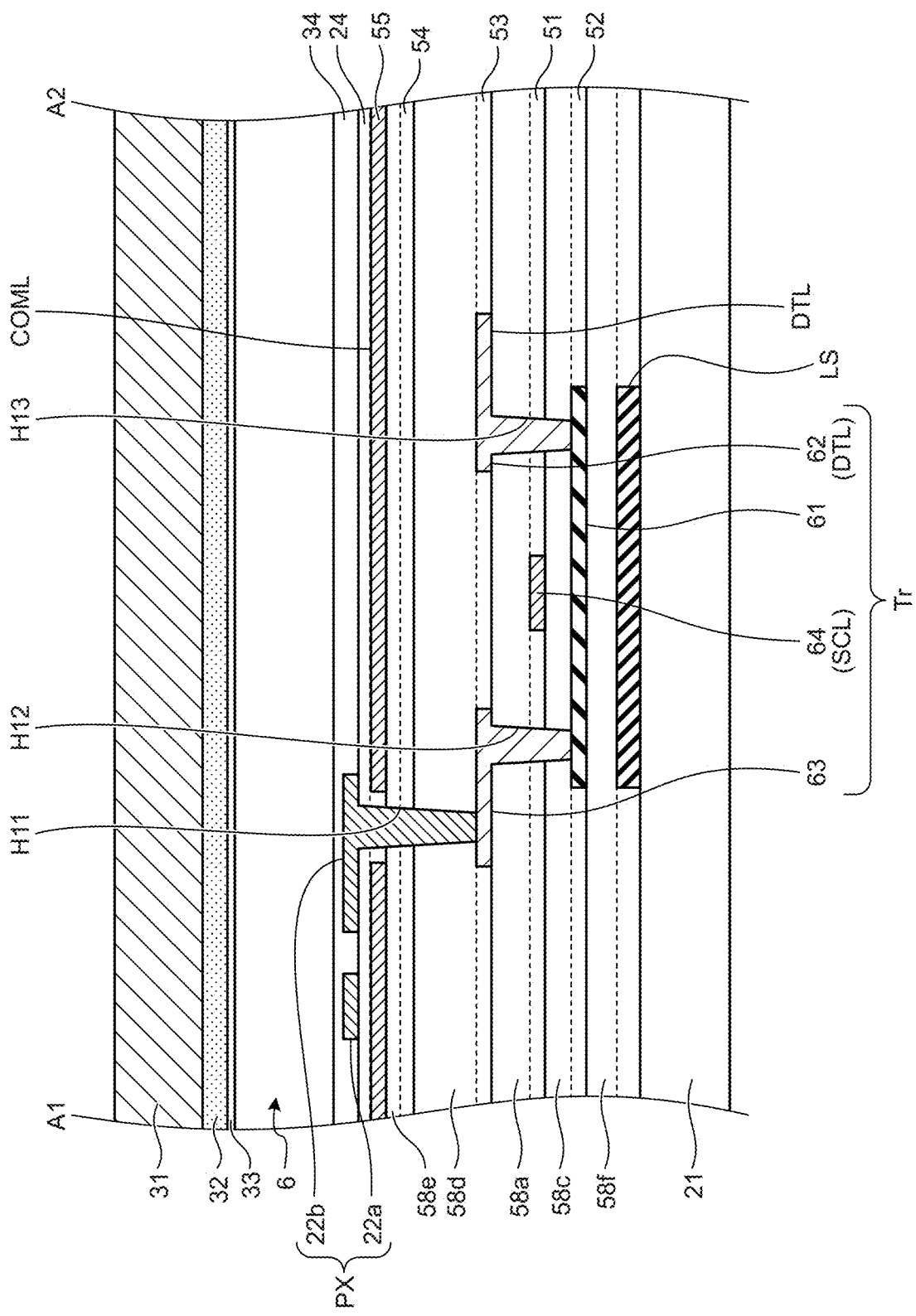
FIG. 5B is a schematic of a second example of the section along line A1-A2 of FIG. 4.

Next, a schematic structure of the display device 1 according to the embodiment is described with reference to FIGS. 3 to 5B. FIG. 3 is a sectional view of a schematic sectional structure of the display device. FIG. 4 is a plan view of an exemplary configuration of the pixel. FIG. 5A is a schematic of a first example of a section along line A1-A2 of FIG. 4. In the first example illustrated in FIG. 5A, a bottom-gate transistor is used as the pixel transistor Tr. FIG. 5B is a schematic of a second example of the section along line A1-A2 of FIG. 4. In the second example illustrated in FIG. 5B, a top-gate transistor is used as the pixel transistor Tr.

An array substrate 2 includes a first substrate 21 made of glass or transparent resin, a plurality of pixel electrodes PX, the common electrode COML, and an insulating layer 24 that insulates the pixel electrodes PX from the common electrode COML. The pixel electrodes PX are disposed on the first substrate 21 in a matrix having a row-column configuration (matrix form), for example. The common electrode COML is provided between the first substrate 21 and the pixel electrodes PX.

The pixel electrodes PX are provided corresponding to the respective pixels Pix. The pixel signal SIG for performing a display operation is supplied from the signal line selection circuit 43 to the pixel electrode PX via the signal line DTL and the pixel transistor Tr. In the display operation, the common potential VCOM for display serving as a voltage signal is supplied from the driver IC 4 to the common electrode COML. The common potential VCOM is preferably a potential different from the GND potential and is approximately −0.7 V, for example. The common potential VCOM is set to the optimum value that does not cause flicker in the driving method, such as the column inversion driving method and the frame inversion driving method. While the common potential VCOM is preferably a fixed potential, it may have a waveform composed of AC square waves.

The pixel electrodes PX and the common electrode COML are made of translucent conductive material, such as indium tin oxide (ITO). A polarizing plate 35B is provided under the first substrate 21 with an adhesive layer (not illustrated) interposed therebetween.

A counter substrate 3 includes a second substrate 31 made of glass or transparent resin, and a color filter 32 and a light-shielding layer (not illustrated) formed on one surface of the second substrate 31. A polarizing plate 35A is provided on the second substrate 31 with an adhesive layer (not illustrated) interposed therebetween.

The array substrate 2 and the counter substrate 3 are disposed facing each other with a predetermined space (cell gap) interposed therebetween. The space between the first substrate 21 and the second substrate 31 is provided with a liquid crystal layer 6 serving as a display function layer. The liquid crystal layer 6 modulates light passing therethrough by changing the orientation state of the liquid crystal molecules for each pixel Pix according to the state of the electric field between each pixel electrode PX and the common electrode COML. The liquid crystal according to the present embodiment is liquid crystal suitable for a lateral electric field mode, such as in-plane switching (IPS) including fringe field switching (FFS).

The array substrate 2 includes the pixel transistors Tr of the respective pixels Pix and wiring, such as the signal lines DTL and the scanning lines (gate lines) SCL. The signal lines DTL supply the pixel signals SIG to the pixel electrodes PX. The scanning lines (gate lines) SCL supply the gate signals GATE to drive the pixel transistors Tr. The signal lines DTL and the scanning lines (gate lines) SCL extend in a plane parallel to the surface of the first substrate 21.

As illustrated in FIG. 4, the region surrounded by the scanning lines (gate lines) SCL and the signal lines DTL is the pixel Pix. The pixel electrode PX includes a plurality of strip electrodes 22a and connecting parts 22b.

As illustrated in FIG. 4, the pixel transistor Tr includes a semiconductor 61, a source electrode 62, a drain electrode 63, and a gate electrode 64.

As illustrated in FIG. 5A, a gate line layer 51 is provided on the first substrate 21 in the configuration using a bottom-gate transistor as the pixel transistor Tr. The gate line layer 51 is provided with the gate electrode 64 (scanning line (gate line) SCL). An insulating layer 58a (second insulating layer) is provided on the first substrate 21 to cover the gate electrode 64. A semiconductor layer 52 is provided on the insulating layer 58a. The semiconductor layer 52 is provided with the semiconductor 61. A signal line layer 53 is provided on the semiconductor layer 52 with an insulating layer 58c (first insulating layer) interposed therebetween.

As illustrated in FIG. 5B, a light shield LS is provided on the first substrate 21 in the configuration using a top-gate transistor as the pixel transistor Tr. The semiconductor layer 52 is provided on the light shield LS with an insulating layer 58f interposed therebetween. The semiconductor layer 52 is provided with the semiconductor 61. The gate line layer 51 is provided on the semiconductor layer 52 with the insulating layer 58c interposed therebetween. The gate line layer 51 is provided with the gate electrode 64. The insulating layer 58a is provided on the insulation layer 58c to cover the gate electrode 64. The signal line layer 53 is provided on the gate line layer 51 with the insulating layer 58a interposed therebetween.

The signal line layer 53 is provided with the drain electrode 63 and the source electrode 62 (signal line DTL). An auxiliary wiring layer 54 is provided on the drain electrode 63 and the source electrode 62 (signal line DTL) with an insulating layer 58d (third insulating layer) interposed therebetween. A common electrode layer 55 is provided on the auxiliary wiring layer 54 with an insulating layer 58e interposed therebetween. The common electrode layer 55 is provided with the common electrode COML. A configuration in which the auxiliary wiring layer and the common electrode layer are stacked without any insulating layer interposed therebetween may be employed. The pixel electrode PX is provided on the common electrode layer 55 with the insulating layer 24 interposed therebetween.

As illustrated in FIG. 4 and FIG. 5A (or FIG. 5B), the pixel electrode PX is coupled to the drain electrode 63 of the pixel transistor Tr through a contact hole H11. The drain electrode 63 is coupled to the semiconductor 61 through a contact hole H12. The semiconductor 61 intersects the gate electrode 64 in plan view. The gate electrode 64 is coupled to the scanning line (gate line) SCL and protrudes from one side of the scanning line (gate line) SCL. The semiconductor 61 extends to the position overlapping the source electrode 62 and is electrically coupled to the source electrode 62 through a contact hole H13. The source electrode 62 is coupled to the signal line DTL and protrudes from one side of the signal line DTL.

The semiconductor 61 can be made of known material, such as polysilicon and oxide semiconductors. For example, the use of a transparent amorphous oxide semiconductor (TAOS) can enhance the ability to hold the voltage for video display for a long time (retention rate) and improve the display quality. In addition, oxide semiconductors including TAOS have low leakage current when the pixel transistor Tr is turned off.

The gate electrode 64 (scanning line (gate line) SCL) is made of aluminum (Al), copper (Cu), silver (Ag), molybdenum (Mo), or an alloy of these metals, for example. The drain electrode 63 and the source electrode 62 (signal line DTL) are made of titanium aluminum (TiAl), which is an alloy of titanium and aluminum, for example.

The insulating layers 24, 58a, 58c, 58d, 58e, and 58f can be made of known insulating material. The insulating layer 58b, for example, can be made of tetra ethyl ortho silicate (TEOS). The insulating layer 58c, for example, can be made of a silicon oxide film ($SiO_2$). The insulating layer 58d is made of an organic insulating film, such as acrylic. With this structure, the surface provided with the common electrode COML can be flattened.

Similarly to the gate electrode 64 (scanning line (gate line) SCL), the auxiliary wiring layer 54 is made of aluminum (Al), copper (Cu), silver (Ag), molybdenum (Mo), or an alloy of these metals, for example.

Figure 6:
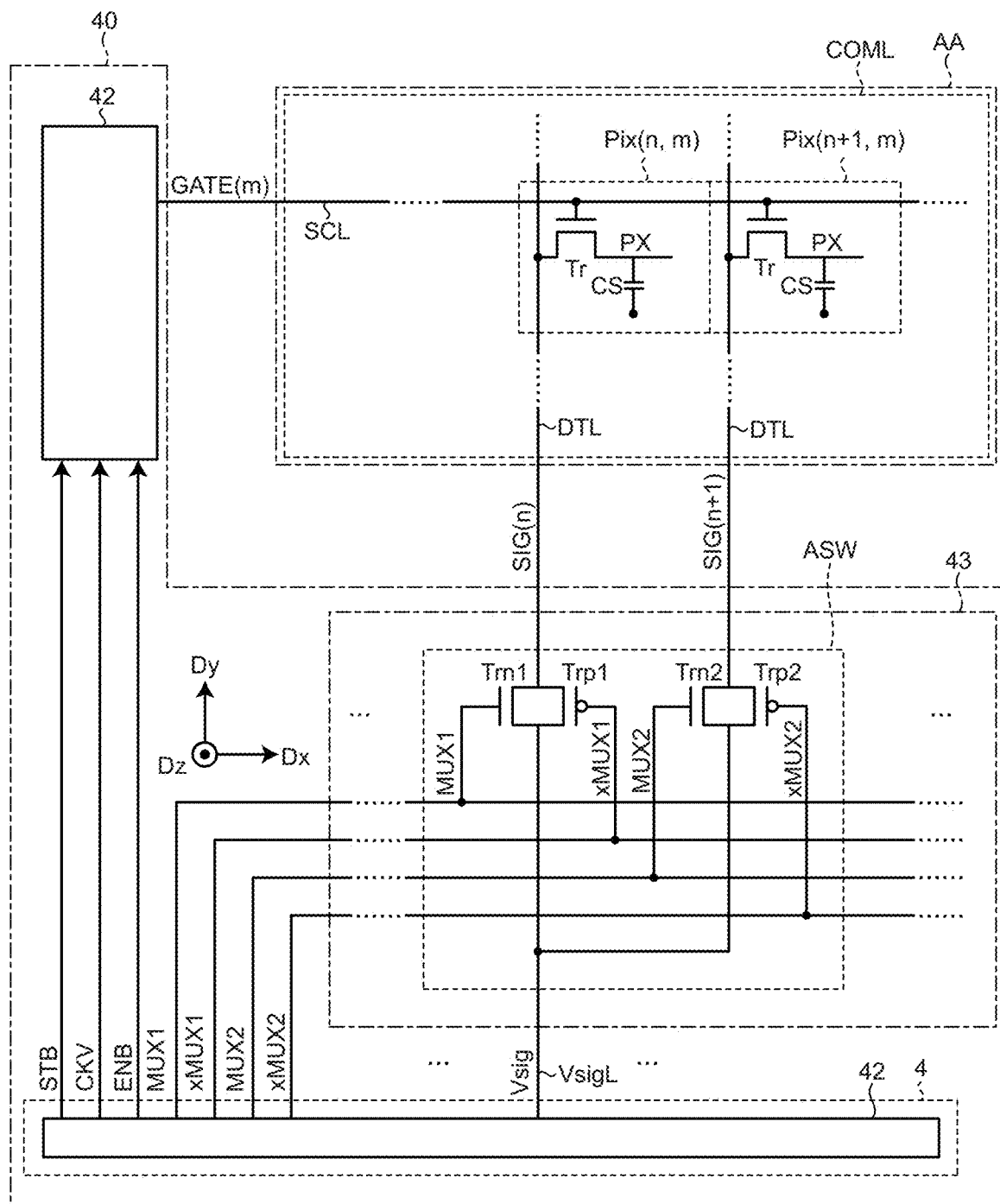
FIG. 6 is a diagram of an example of a drive circuit configuration.

FIG. 6 is a diagram of an example of a drive circuit configuration. FIG. 6 illustrates an exemplary circuit configuration corresponding to the pixel Pix(n, m) and the Pix(n+1, m). The pixel Pix(n, m) represents the n-th pixel Pix from the left in the figure out of the pixels Pix arrayed in the Dx direction (first direction) and the m-th pixel Pix from the top in the figure out of the pixels Pix arrayed in the Dy direction (second direction) in the pixel array illustrated in FIG. 2. The pixel Pix(n+1, m) represents the n+1-th pixel Pix from the left in the figure out of the pixels Pix arrayed in the Dx direction (first direction) and the m-th pixel Pix from the top in the figure out of the pixels Pix arrayed in the Dy direction (second direction) in the pixel array illustrated in FIG. 2.

The circuit elements constituting the drive circuit 40 operate by being supplied with the first power supply voltage signal PSIG1 and the second power supply voltage signal PSIG2 from the power supply device 12. The potential (first potential VGH) of the first power supply voltage signal PSIG1 is a high potential of the scanning signal (gate signal) GATE(m) supplied to the gate of the pixel transistor Tr. The potential (second potential VGL) of the second power supply voltage signal PSIG2 is a low potential of the scanning signal GATE(m) supplied to the gate of the pixel transistor Tr.

The display control circuit 44 (driver IC 4) controls the gate driver 42 and the signal line selection circuit 43. Specifically, the display control circuit 44 (driver IC 4) supplies synchronization signals, such as a start pulse signal STV and a shift clock signal CKV, and a scanning line drive signal ENB to the gate driver 42. The display control circuit 44 (driver IC 4) supplies selection control signals MUX to the signal line selection circuit 43. The potential (first potential VGH) of the first power supply voltage signal PSIG1 is a high potential of the selection control signal MUX, for example. The potential (second potential VGL) of the second power supply voltage signal PSIG2 is a low potential of the selection control signal MUX, for example. The present disclosure is not limited by the potential of the selection control signal MUX.

The gate driver 42 is a circuit that generates a scanning signal GATE(m) to be supplied to the gate of the pixel transistor Tr based on the start pulse signal STV, the shift clock signal CKV, and the scanning line drive signal ENB output from the display control circuit 44 (driver IC 4).

Specifically, the scanning signal GATE(m) is set to the high potential (first potential VGH) in the selection period of the scanning line SCL coupled to the m-th pixel row. As a result, the pixel transistors Tr of the pixels Pix(n, m) and Pix(n+1, m) are controlled to be turned on.

The scanning signal GATE(m) is set to the low potential (second potential VGL) in the non-selection period of the scanning line SCL coupled to the m-th pixel row. As a result, the pixel transistors Tr of the pixels Pix(n, m) and Pix(n+1, m) are controlled to be turned off.

The signal line selection circuit 43 includes a switch circuit ASW that supplies a pixel signal SIG(n) to the pixel Pix(n, m) and a pixel signal SIG(n+1) to the pixel Pix(n+1, m) by time-dividing the selection period of the scanning line SCL coupled to the m-th pixel row. In the example illustrated in FIG. 6, the switch circuit ASW includes switch transistors Trn1 and Trn2 composed of n-type TFTs and switch transistors Trp1 and Trp2 composed of p-type TFTs.

In the signal line selection circuit 43, a plurality of switch circuits ASW are arrayed in the Dx direction (first direction) on the array substrate 2. In FIG. 6, the selection period of the scanning line SCL coupled to the m-th pixel row is divided into two periods, and the pixel signals SIG(n) and SIG(n+1) are selectively output in the selection periods of the pixel Pix(n, m) and the pixel Pix(n+1, m), respectively. In this configuration, the total number of switch circuits ASW arrayed in the Dx direction (first direction) is N/2.

Specifically, in the selection period of the signal line DTL coupled to the pixel Pix(n, m), the selection control signal MUX1 is set to the high potential (first potential VGH), and the selection control signal xMUX1 is set to the low potential (second potential VGL). As a result, the switch transistors Trn1 and Trp1 are controlled to be turned on, and the image signal Vsig output from the display control circuit 44 (driver IC 4) is selectively output as the pixel signal SIG(n).

In the selection period of the signal line DTL coupled to the pixel Pix(n+1, m), the selection control signal MUX2 is set to the high potential (first potential VGH), and the selection control signal xMUX2 is set to the low potential (second potential VGL). As a result, the switch transistors Trn2 and Trp2 are controlled to be turned on, and the image signal Vsig output from the display control circuit 44 (driver IC 4) is selectively output as the pixel signal SIG(n+1).

In FIG. 6, the switch circuit ASW with the CMOS configuration is illustrated as an example, the present disclosure is not limited thereto. The switch circuit ASW may be composed only of n-type TFTs or p-type TFTs, for example.

In FIG. 6, the selection period of the scanning line SCL coupled to the m-th pixel row is divided into two periods, and the pixel signals SIG(n) and SIG(n+1) are selectively output in the selection periods of the pixel Pix(n, m) and the pixel Pix(n+1, m), respectively, but the present disclosure is not limited thereto. For example, the selection period of the scanning line SCL coupled to the m-th pixel row may be divided into three or more periods, and the corresponding pixel signal SIG may be selectively output in the selection period of each pixel Pix. When T is the number of divisions of the selection period of the scanning line SCL coupled to the m-th pixel row, in other words, the number of pixels sequentially selected by the switch circuit ASW in the selection period of the scanning line SCL coupled to the m-th pixel row, the total number of switch circuits ASW arrayed in the Dx direction (first direction) is N/T.

Figure 7:
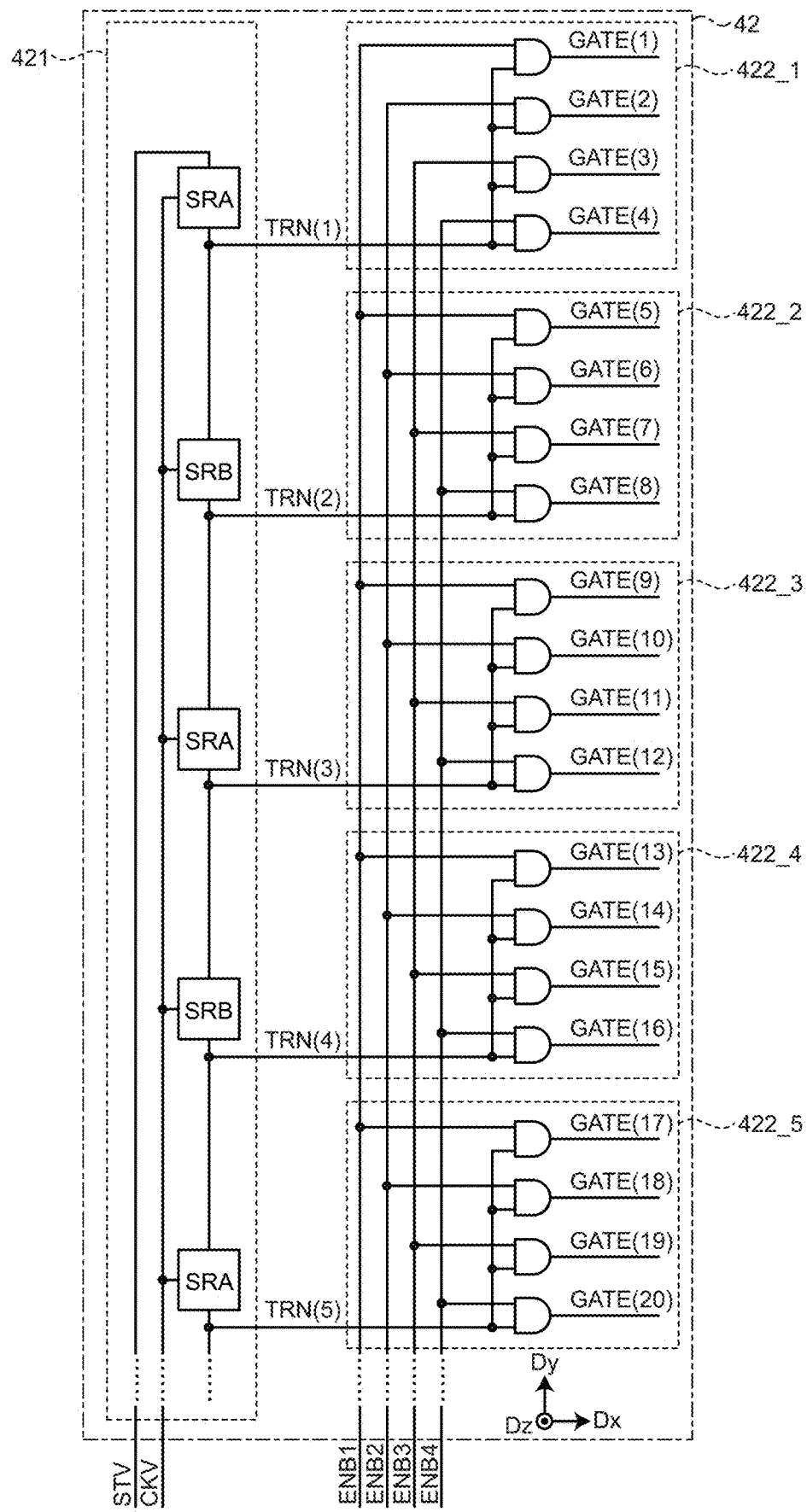
FIG. 7 is a diagram of an example of a gate driver configuration according to a conventional example.
Figure 8:
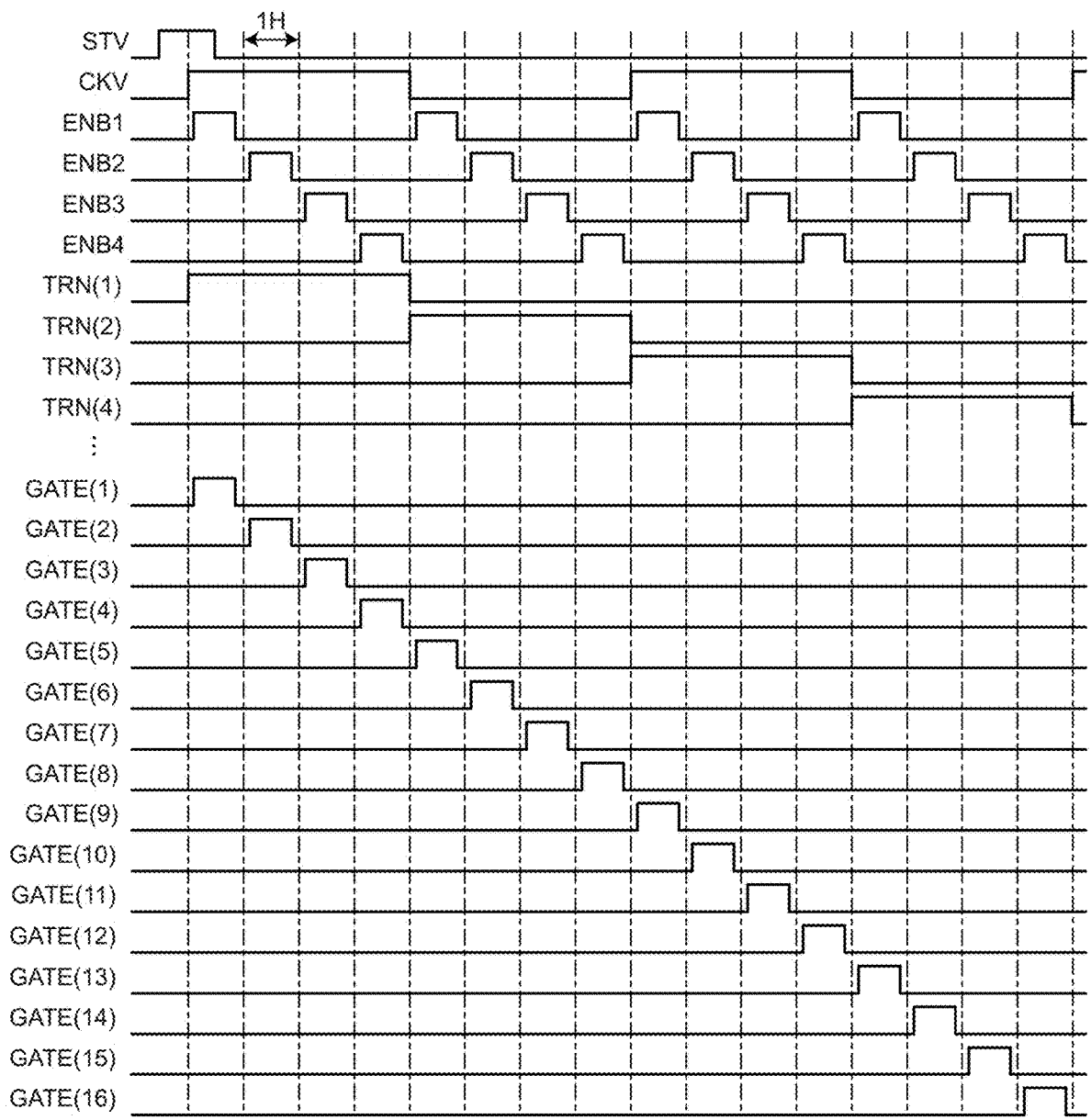
FIG. 8 is a timing chart of each part according to the conventional example.

FIG. 7 is a diagram of an example of a gate driver configuration according to a conventional example. FIG. 8 is a timing chart of each part according to the conventional example. In the present disclosure, one horizontal period (1H) is defined as the period between the alternate long and short dash lines in the timing chart of each part illustrated in FIGS. 8, 11, 15, and 17.

In the configuration according to the conventional example illustrated in FIG. 7, the gate driver 42 includes a shift register circuit 421 and a plurality of output circuits 422_p (p is an integer of 1 or larger).

The shift register circuit 421 is composed of register circuits SRA and register circuits SRB alternately cascaded in descending (or ascending) order. The register circuit SRA outputs a binary signal that maintains the high potential of the input signal at the rising edge of the shift clock signal CKV until the falling edge of the shift clock signal CKV. The register circuit SRB outputs a binary signal that maintains the high potential of the input signal at the falling edge of the shift clock signal CKV until the rising edge of the shift clock signal CKV.

The output circuits 422_p are provided corresponding to the respective register circuits SRA and SRB. The output circuits 422_p each include Q (herein, four) 2-input 1-output AND circuits that generate the logical value of the scanning signal GATE(m) to be supplied to Q (herein, four) scanning lines SCL arrayed in the Dy direction (second direction). The output circuit 422_p may include a drive circuit in the subsequent stage of each AND circuit.

The shift register circuit 421 receives the start pulse signal STV and the shift clock signal CKV that is at a high potential for Q horizontal periods (herein, four horizontal periods) and at a low potential for the following Q horizontal periods (herein, four horizontal periods). The shift clock signal CKV is input to each of the register circuits SRA and SRB constituting the shift register circuit 421. The start pulse signal STV is input to the register circuit SRA in the first stage arrayed in descending (or ascending) order in the shift register circuit 421. Thereafter, an output signal TRN(odd) of the register circuit SRA in the previous stage (or an output signal TRN(even) of the register circuit SRB) is input to the register circuit SRB (or the register circuit SRA) in the subsequent stage.

The AND circuit generates the logical product of the output signal TRN(odd) of the register circuit SRA (or the output signal TRN(even) of the register circuit SRB) and an enable signal ENBq (q is an integer from 1 to Q (herein, four)) as the logical value of the scanning signal GATE(m). Each AND circuit receives the enable signal ENBq that is at a high potential for one horizontal period in descending (or ascending) order in a manner shifted by one horizontal period.

With the gate driver configuration according to the conventional example described above, the scanning signal GATE(m) that is at a high potential for one horizontal period is supplied to the scanning lines SCL arrayed in the Dy direction (second direction) in descending (or ascending) order in a manner shifted by one horizontal period.

Figure 9A:
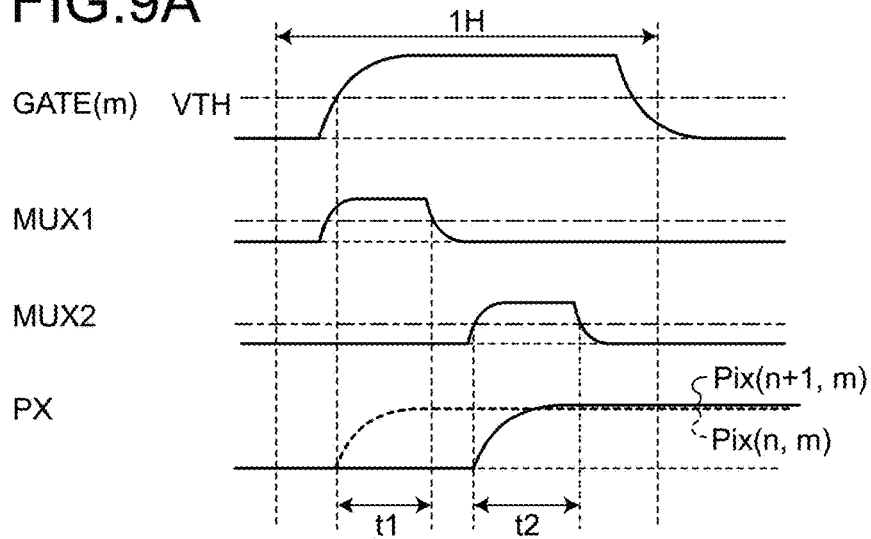
FIG. 9A is a diagram of an example of a first waveform according to the conventional example.
Figure 9B:
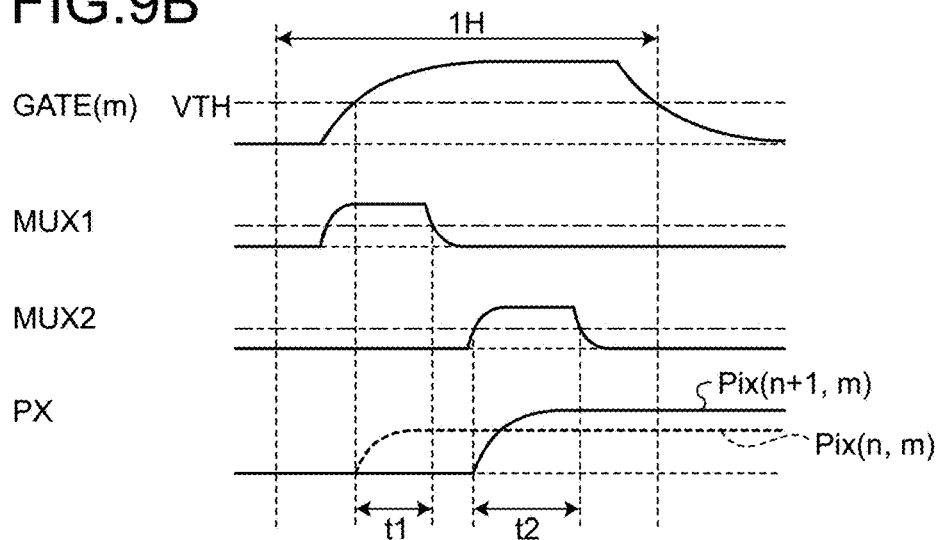
FIG. 9B is a diagram of an example of a second waveform according to the conventional example.
Figure 9C:
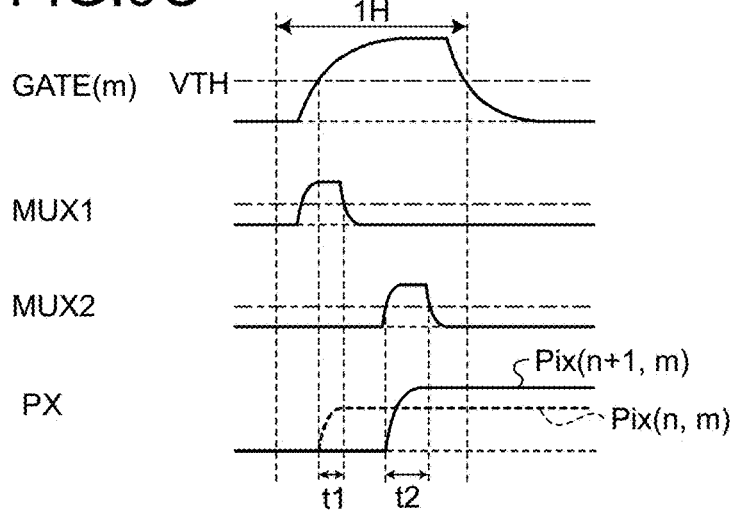
FIG. 9C is a diagram of an example of a third waveform according to the conventional example.
Figure 10:
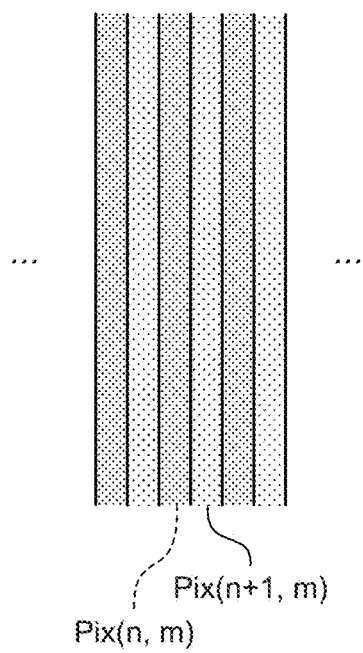
FIG. 10 is a view of an example of a display defect according to the conventional example.

FIG. 9A is a diagram of an example of a first waveform according to the conventional example. FIG. 9B is a diagram of an example of a second waveform according to the conventional example. FIG. 9C is a diagram of an example of a third waveform according to the conventional example. FIG. 10 is a view of an example of a display defect according to the conventional example.

In FIGS. 9A, 9B and 9C, the pixel signal SIG(n) for the pixel Pix(n, m) and the pixel signal SIG(n+1) for the pixel Pix(n+1, m) are sequentially supplied by the selection control signals MUX1, xMUX1, MUX2, and xMUX2 being controlled by the display control circuit 44 (driver IC4) in one horizontal period (1H) in which the scanning signal GATE(m) is output, for example. FIGS. 9A, 9B, and 9C illustrate an example where the potential of the pixel signal SIG(n) is equal to that of the pixel signal SIG(n+1).

In FIGS. 9A, 9B, and 9C, the switch transistor Trn1 is turned on, and the pixel signal SIG(n) is supplied in the area where the selection control signal MUX1 is equal to or higher than the potential indicated by the alternate long and short dash line, and the switch transistor Trn2 is turned on, and the pixel signal SIG(n+1) is supplied in the area where the selection control signal MUX2 is equal to or higher than the potential indicated by the alternate long and short dash line, for example. The potential at which the switch transistors Trn1 and Trn2 are turned on varies depending on the potential of the pixel signals SIG(n) and SIG(n+1).

In a period t1 when the ON period of the switch transistor Trn1 (supply period of the pixel signal SIG(n)) overlaps the ON period of the pixel transistor Tr, the pixel electrode PX of the pixel Pix(n, m) is charged according to the potential of the pixel signal SIG(n). In a period t2 when the ON period of the switch transistor Trn2 (supply period of the pixel signal SIG(n+1)) overlaps the ON period of the pixel transistor Tr, the pixel electrode PX of the pixel Pix(n+1, m) is charged according to the potential of the pixel signal SIG (n+1).

The ON timing of the pixel transistor Tr is delayed by the time constant of the scanning line SCL. Specifically, the pixel transistor Tr is turned on when the potential of the scanning signal GATE(m) exceeds a threshold voltage VTH of the pixel transistor Tr. Therefore, the pixel transistor Tr may possibly be turned on after the timing at which the switch transistor Trn1 is turned on. As a result, as illustrated in FIG. 9A, the charging period t1 of the pixel electrode PX of the pixel Pix(n, m) is shorter than the charging period t2 of the pixel electrode PX of the pixel Pix(n+1, m).

FIG. 9B illustrates an example where the length of one horizontal period (1H) is equal to that in FIG. 9A in a display panel with higher definition than in FIG. 9A. In this case, the time constant of the scanning line SCL is larger than in FIG. 9A, and the ON timing of the pixel transistor Tr is further delayed. As a result, the charging period t1 of the pixel electrode PX of the pixel Pix(n, m) is even shorter than the charging period t2 of the pixel electrode PX of the pixel Pix(n+1, m).

FIG. 9C illustrates an example where the length of one horizontal period (1H) is shorter than that in FIG. 9A in the same display panel as that in FIG. 9A. In this case, the ON timing of the pixel transistor Tr is delayed relatively to one horizontal period, and the charging period t1 of the pixel electrode PX of the pixel Pix(n, m) is relatively shorter than the charging period t2 of the pixel electrode PX of the pixel Pix(n+1, m).

If the charging period t1 of the pixel electrode PX of the pixel Pix(n, m) is shorter than the charging period t2 of the pixel electrode PX of the pixel Pix(n+1, m) due to higher definition and higher display speed of the display panel as illustrated in FIGS. 9B and 9C, the charge potential of the pixel electrode PX of the pixel Pix(n, m) may possibly be lower than that of the pixel Pix(n+1, m). In this case, as illustrated in FIG. 10, the pixel row including the pixel Pix(n+1, m) is displayed darker than the pixel row including the pixel Pix(n+1, m).

Figure 11:
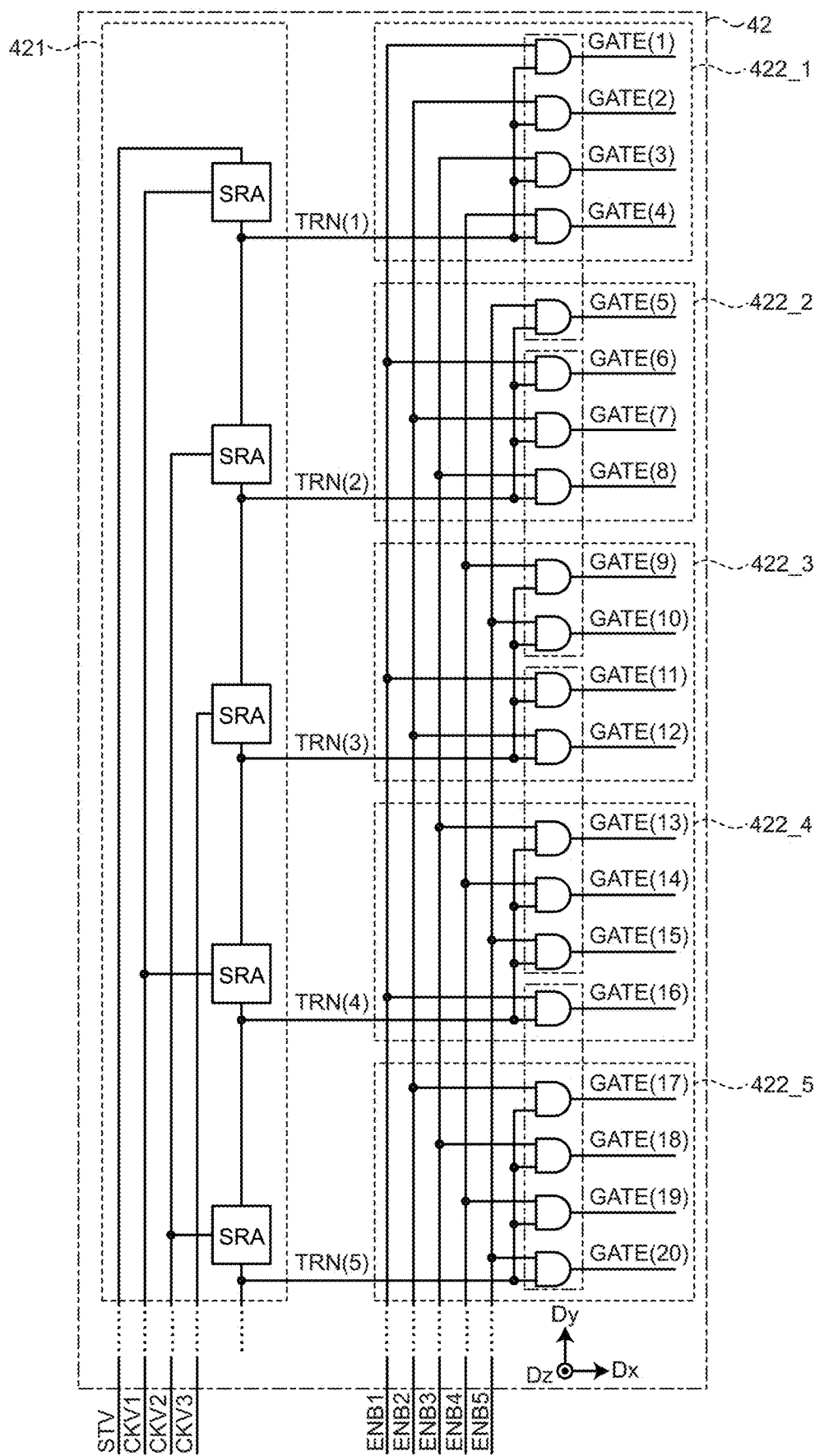
FIG. 11 is a diagram of an example of the gate driver configuration according to an embodiment.
Figure 12:
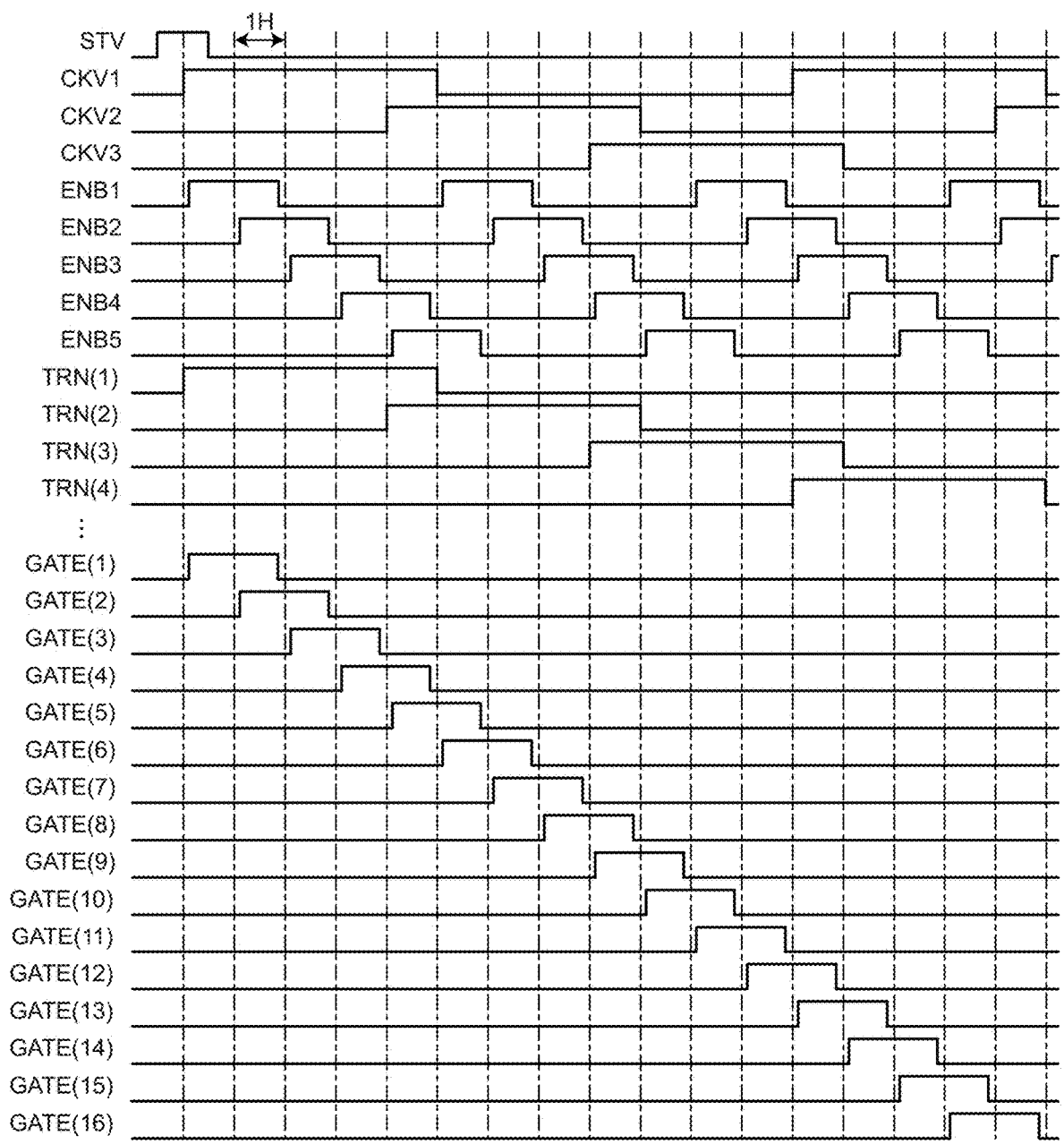
FIG. 12 is a timing chart of each part in the configuration illustrated in FIG. 11.

FIG. 11 is a diagram of an example of the gate driver configuration according to the embodiment. FIG. 12 is a timing chart of each part in the configuration illustrated in FIG. 11. The following describes components different from those in the configuration according to the conventional example illustrated in FIG. 7 in detail, and explanation of components similar to those in the configuration according to the conventional example illustrated in FIG. 7 may be omitted.

In the configuration according to the embodiment illustrated in FIG. 11, the shift register circuit 421 is composed of a plurality of register circuits SRA cascaded in descending (or ascending) order. The register circuit SRA outputs a binary signal that maintains the high potential of the input signal at the rising edge of the shift clock signal CKV until the falling edge of the shift clock signal CKV.

Each register circuit SRA receives the shift clock signal CKV1, CKV2, or CKV3 that is at a high potential for Q+1 horizontal periods in descending (or ascending) order in a manner shifted by Q horizontal periods. The start pulse signal STV is input to the register circuit SRA in the first stage arrayed in descending (or ascending) order in the shift register circuit 421. Thereafter, the output signal TRN(r) of the register circuit SRA in the previous stage is input to the register circuit SRA in the subsequent stage.

The AND circuit generates the logical product of the output signal TRN(r) of the register circuit SRA and an enable signal ENBs (s is an integer from 1 to S (=Q+1, herein 5)) as the logical value of the scanning signal GATE (m). Each AND circuit receives the enable signal ENBs that is at a high potential for two horizontal periods in descending (or ascending) order in a manner shifted by one horizontal period.

With the gate driver configuration according to the embodiment described above, the scanning signal GATE(m) that is at a high potential for two horizontal periods is supplied to the scanning lines SCL arrayed in the Dy direction (second direction) in descending (or ascending) order in a manner shifted by one horizontal period.

Figure 13A:
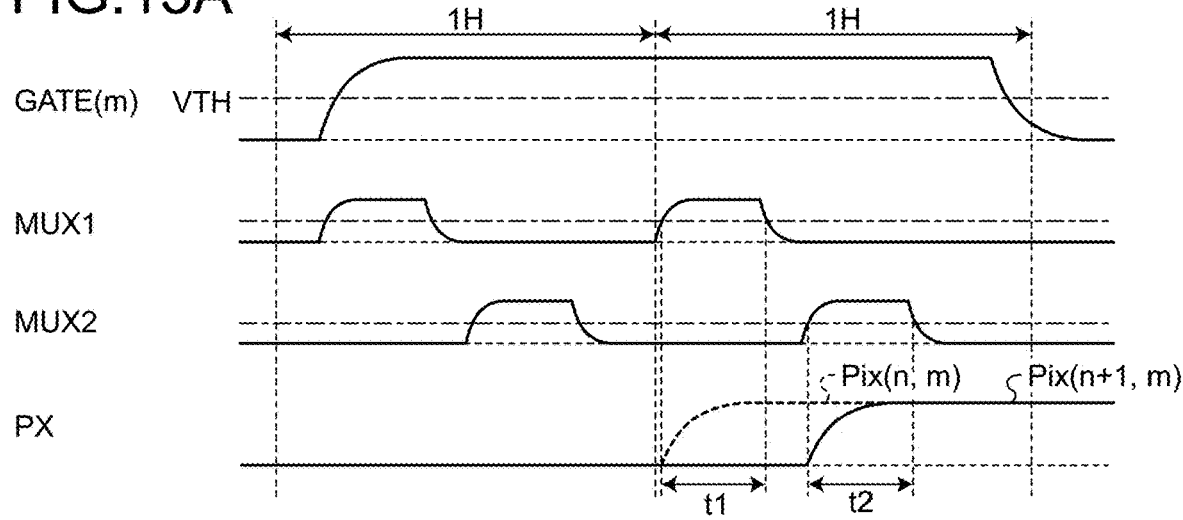
FIG. 13A is a diagram of an example of the first waveform according to the embodiment.
Figure 13B:
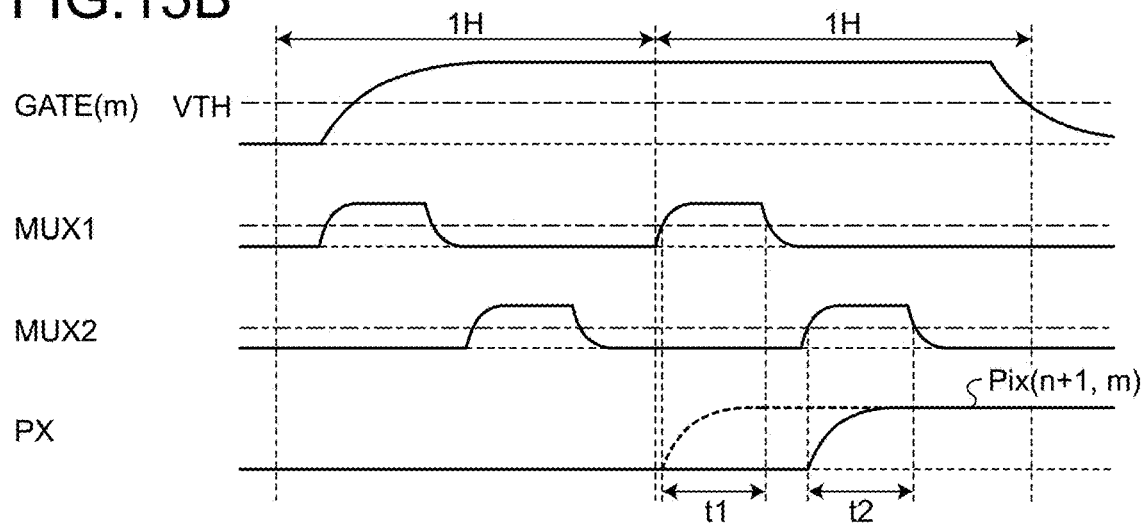
FIG. 13B is a diagram of an example of the second waveform according to the embodiment.
Figure 13C:
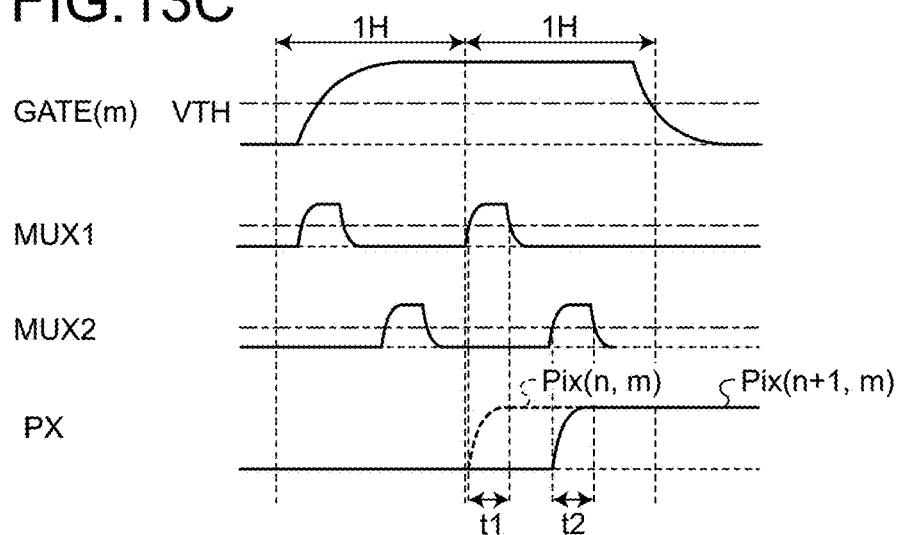
FIG. 13C is a diagram of an example of the third waveform according to the embodiment.

FIG. 13A is a diagram of an example of the first waveform according to the embodiment. FIG. 13B is a diagram of an example of the second waveform according to the embodiment. FIG. 13C is a diagram of an example of the third waveform according to the embodiment.

In FIGS. 13A, 13B and 13C, the pixel signal SIG(n) for the pixel Pix(n, m) and the pixel signal SIG(n+1) for the pixel Pix(n+1, m) are sequentially supplied by the selection control signals MUX1, xMUX1, MUX2, and xMUX2 being controlled by the display control circuit 44 (driver IC4) in one horizontal period (1H) that is the latter half of the two horizontal periods (2H) in which the scanning signal GATE (m) is output, for example. Similarly to FIGS. 9A, 9B, and 9C, FIGS. 13A, 13B, and 13C also illustrate an example where the potential of the pixel signal SIG(n) is equal to that of the pixel signal SIG(n+1).

In FIGS. 13A, 13B, and 13C, the switch transistor Trn1 is turned on, and the pixel signal SIG(n) is supplied in the area where the selection control signal MUX1 is equal to or higher than the potential indicated by the alternate long and short dash line, and the switch transistor Trn2 is turned on, and the pixel signal SIG(n+1) is supplied in the area where the selection control signal MUX2 is equal to or higher than the potential indicated by the alternate long and short dash line, for example. Also in FIGS. 13A, 13B, and 13C, similarly to FIGS. 9A, 9B, and 9C, the potential at which the switch transistors Trn1 and Trn2 are turned on varies depending on the potential of the pixel signals SIG(n) and SIG(n+1).

As described above, the ON timing of the pixel transistor Tr is delayed by the time constant of the scanning line SCL. Specifically, the pixel transistor Tr is turned on when the potential of the scanning signal GATE(m) exceeds a threshold voltage VTH of the pixel transistor Tr.

Similarly to FIG. 9B according to the conventional example, FIG. 13B illustrates an example where the length of one horizontal period (1H) is equal to that in FIG. 13A in a display panel with higher definition than in FIG. 13A.

Similarly to FIG. 9C according to the conventional example, FIG. 13C illustrates an example where the length of one horizontal period (1H) is shorter than that in FIG. 13A in the same display panel as that in FIG. 13A.

In the configuration according to the embodiment, the scanning signal GATE(m) is set to a high potential for two horizontal periods (2H), and the switch transistor Trn1 can be turned on after the potential of the scanning signal GATE(m) exceeds the threshold voltage VTH of the pixel transistor Tr and the pixel transistor Tr is turned on. As a result, as illustrated in FIG. 13A, the charging period t1 of the pixel electrode PX of the pixel Pix(n, m) can be made equivalent to the charging period t2 of the pixel electrode PX of the pixel Pix(n+1, m).

Also in the example illustrated in FIG. 13B where the length of one horizontal period (1H) is equal to that in FIG. 13A in a display panel with higher definition than in FIG. 13A, the switch transistor Trn1 can be turned on after the pixel transistor Tr is turned on. As a result, similarly to FIG. 13A, the charging period t1 of the pixel electrode PX of the pixel Pix(n, m) can be made equivalent to the charging period t2 of the pixel electrode PX of the pixel Pix(n+1, m).

Also in the example illustrated in FIG. 13C where the length of one horizontal period (1H) is shorter than that in FIG. 13A in the same display panel as that in FIG. 13A, the switch transistor Trn1 can be turned on after the pixel transistor Tr is turned on. As a result, similarly to FIG. 13A, the charging period t1 of the pixel electrode PX of the pixel Pix(n, m) can be made equivalent to the charging period t2 of the pixel electrode PX of the pixel Pix(n+1, m).

As described above, the configuration according to the embodiment can prevent the delay in the ON timing of the pixel transistor Tr caused by the time constant of the scanning line SCL by sequentially supplying the pixel signal SIG(n) for the pixel Pix(n, m) and the pixel signal SIG(n+1) for the pixel Pix(n+1, m) in one horizontal period (1H) that is the latter half of the two horizontal periods (2H) in which the scanning signal GATE(m) is output without adding any circuit to the configuration according to the conventional example illustrated in FIGS. 7 and 8. This configuration can suppress reduction in the charging period t1 of the pixel electrode PX of the pixel Pix(n, m) and reduction in the charge potential of the pixel electrode PX of the pixel Pix(n, m) due to higher definition and higher display speed of the display panel.

First Modification

Figure 14:
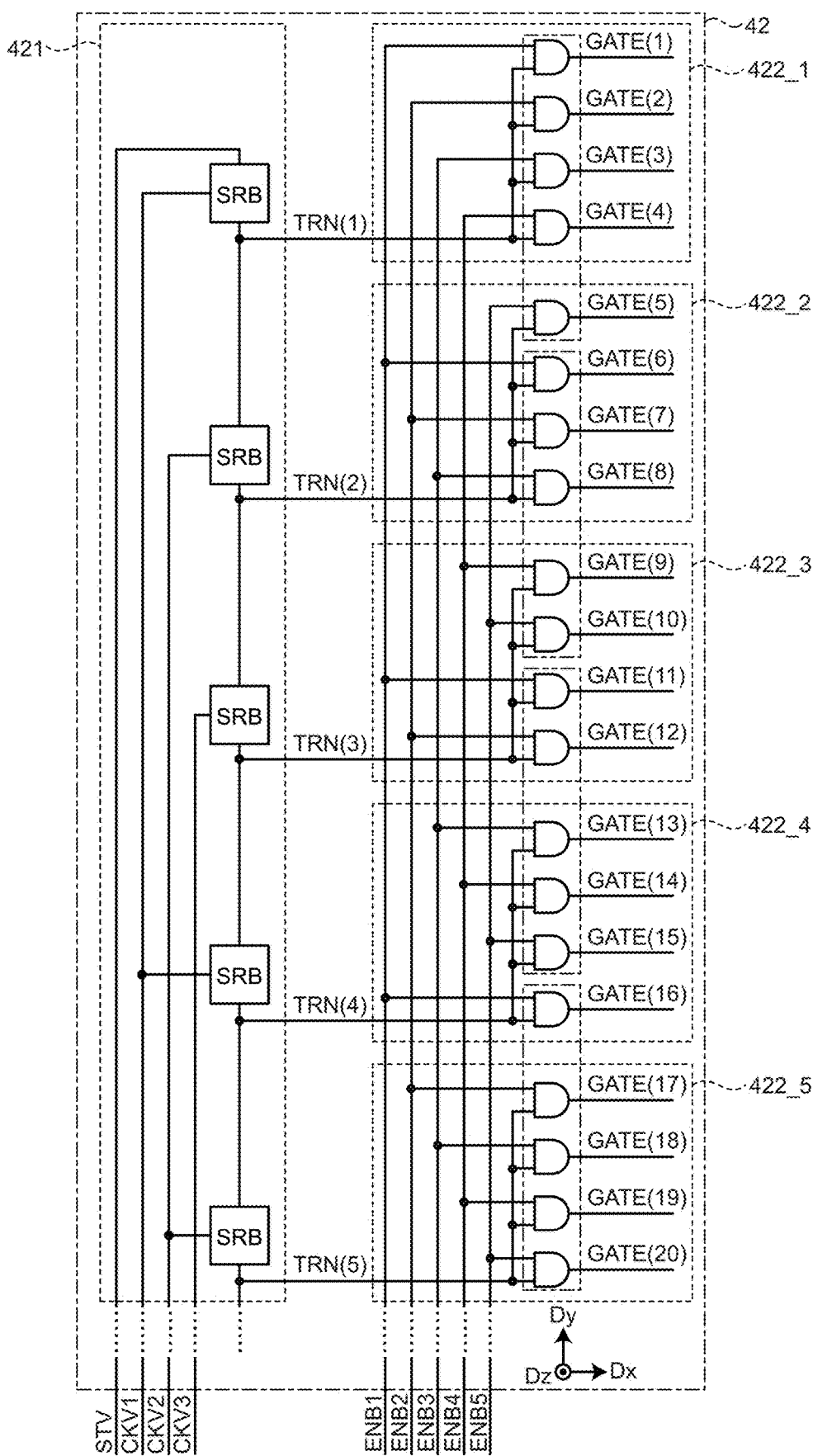
FIG. 14 is a diagram of an example of the gate driver configuration according to a first modification of the embodiment.
Figure 15:
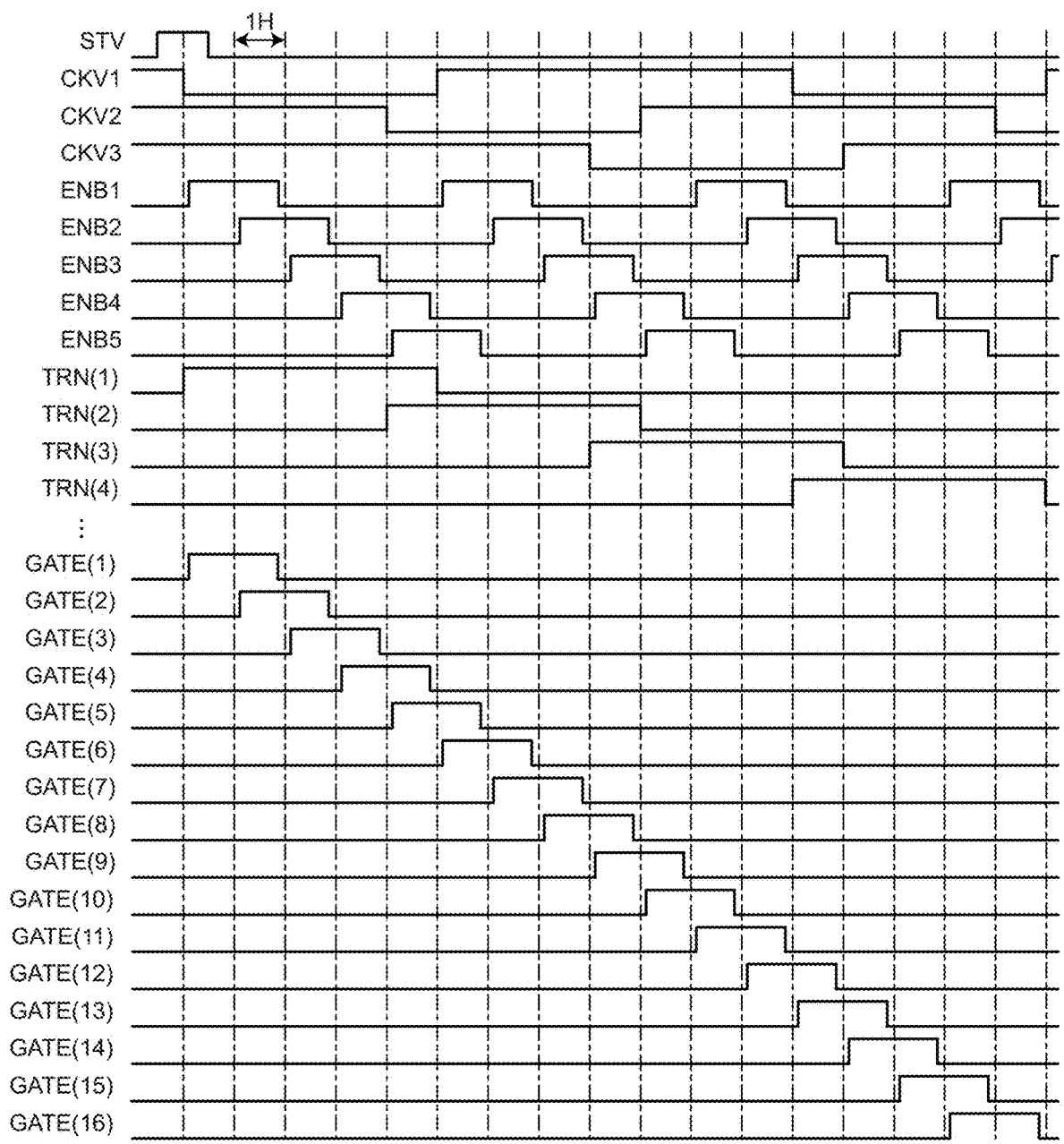
FIG. 15 is a timing chart of each part in the configuration illustrated in FIG. 14.

FIG. 14 is a diagram of an example of the gate driver configuration according to a first modification of the embodiment. FIG. 15 is a timing chart of each part in the configuration illustrated in FIG. 14. The following describes components different from those in the configuration according to the embodiment illustrated in FIG. 11 in detail, and explanation of components similar to those in the configuration according to the embodiment illustrated in FIG. 11 may be omitted.

In the configuration according to the first modification of the embodiment illustrated in FIG. 14, the shift register circuit 421 is composed of a plurality of register circuits SRB cascaded in descending (or ascending) order. The register circuit SRB outputs a binary signal that maintains the high potential of the input signal at the falling edge of the shift clock signal CKV until the riding edge of the shift clock signal CKV.

Each register circuit SRB receives the shift clock signal CKV1, CKV2, or CKV3 that is at a low potential for Q+1 horizontal periods in descending (or ascending) order in a manner shifted by Q horizontal periods. The start pulse signal STV is input to the register circuit SRB in the first stage arrayed in descending (or ascending) order in the shift register circuit 421. Thereafter, the output signal TRN(r) of the register circuit SRB in the previous stage is input to the register circuit SRB in the subsequent stage.

The configuration according to the first modification of the embodiment is different from the configuration according to the embodiment illustrated in FIGS. 11 and 12 only in that the logical values of the shift clock signals CKV1, CKV2, and CKV3 are inverted. Similarly to the configuration according to the embodiment, the configuration according to the first modification can prevent the delay in the ON timing of the pixel transistor Tr caused by the time constant of the scanning line SCL without adding any circuit to the configuration according to the conventional example illustrated in FIGS. 7 and 8. This configuration can suppress reduction in the charging period t1 of the pixel electrode PX of the pixel Pix(n, m) and reduction in the charge potential of the pixel electrode PX of the pixel Pix(n, m) due to higher definition and higher display speed of the display panel.

Second Modification

Figure 16:
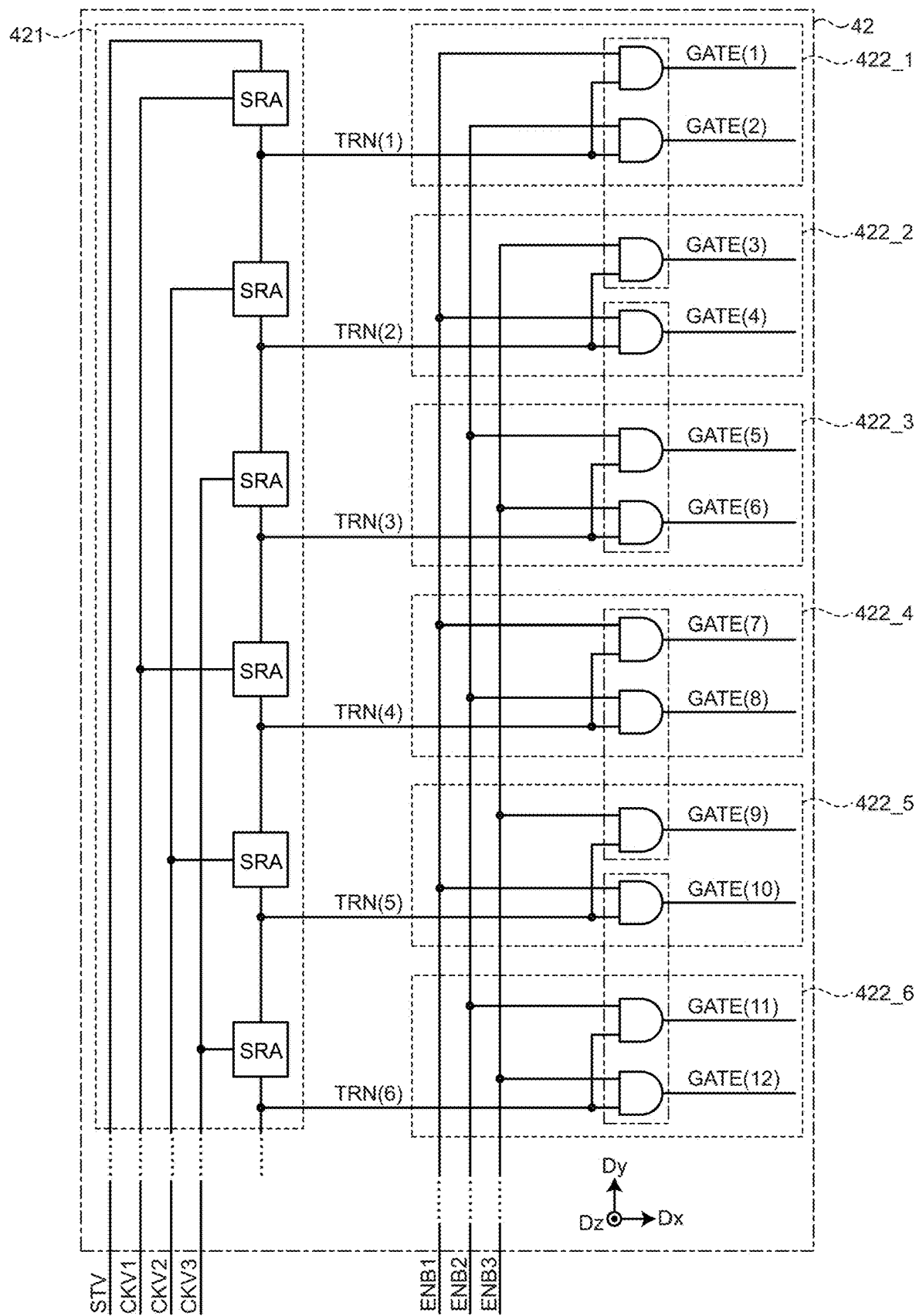
FIG. 16 is a diagram of an example of the gate driver configuration according to a second modification of the embodiment.
Figure 17:
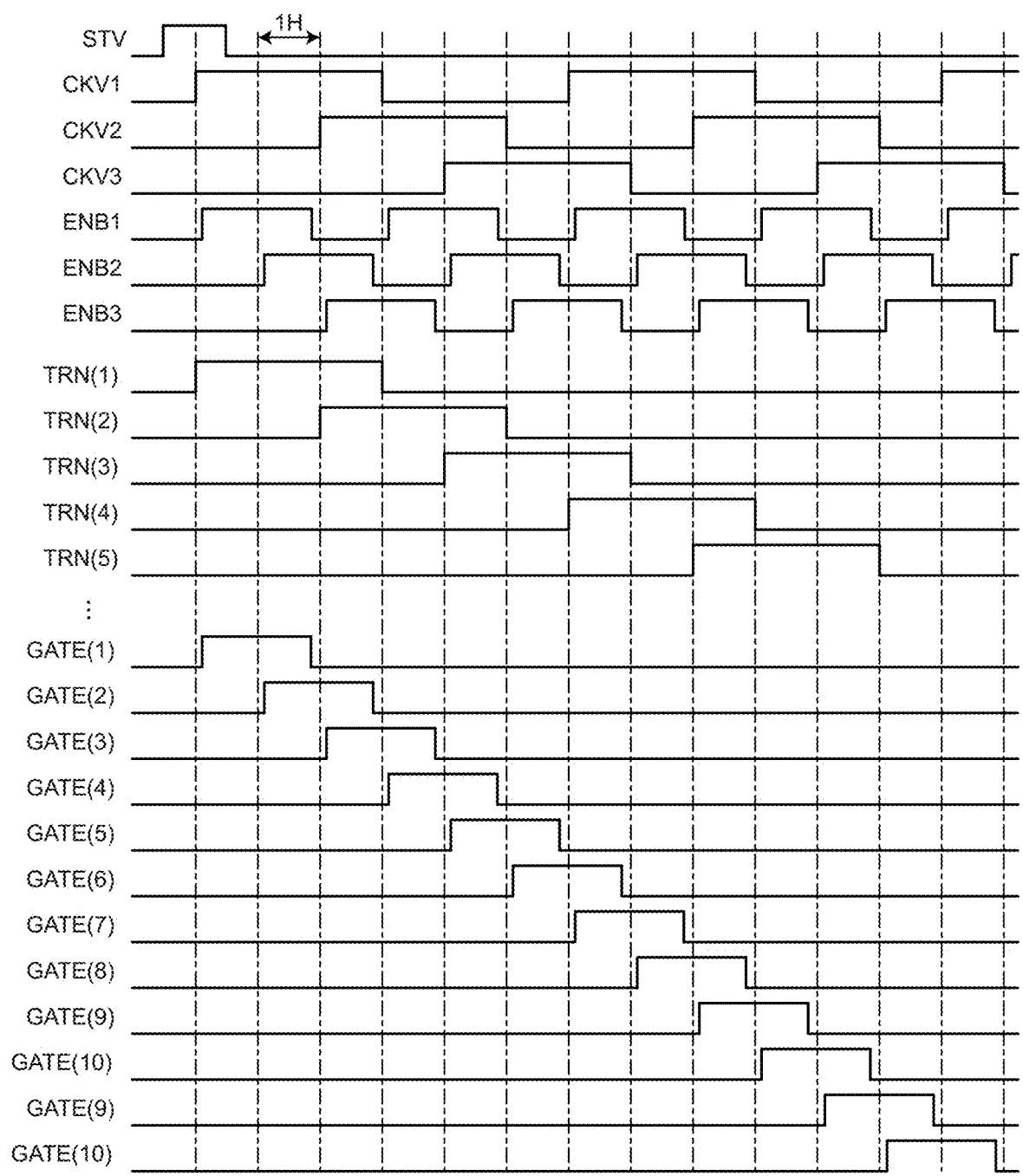
FIG. 17 is a timing chart of each part in the configuration illustrated in FIG. 16.

FIG. 16 is a diagram of an example of the gate driver configuration according to a second modification of the embodiment. FIG. 17 is a timing chart of each part in the configuration illustrated in FIG. 16. The following describes components different from those in the configuration according to the embodiment illustrated in FIG. 11 in detail, and explanation of components similar to those in the configuration according to the embodiment illustrated in FIG. 11 may be omitted.

In the configuration according to the second modification of the embodiment illustrated in FIG. 16, the output circuits 422_p each include two 2-input 1-output AND circuits that generate the logical value of the scanning signal GATE(m) to be supplied to two scanning lines SCL arrayed in the Dy direction (second direction).

The AND circuit generates the logical product of the output signal TRN(r) of the register circuit SRA and the enable signal ENBs (s is an integer from 1 to 3) as the logical value of the scanning signal GATE(m). Each AND circuit receives the enable signal ENBs that is at a high potential for two horizontal periods in descending (or ascending) order in a manner shifted by one horizontal period.

The configuration according to the second modification of the embodiment is different from the configuration according to the embodiment illustrated in FIGS. 11 and 12 in the number of AND circuits included in the output circuit 422_p. Similarly to the configuration according to the embodiment, the configuration according to the second modification of the embodiment can prevent the delay in the ON timing of the pixel transistor Tr caused by the time constant of the scanning line SCL without adding any circuit to the configuration according to the conventional example. This configuration can suppress reduction in the charging period t1 of the pixel electrode PX of the pixel Pix(n, m) and reduction in the charge potential of the pixel electrode PX of the pixel Pix(n, m) due to higher definition and higher display speed of the display panel.

Also in the configuration according to the second modification of the embodiment illustrated in FIG. 16 and FIG. 17, the logical values of the shift clock signals CKV1, CKV2, and CKV3 may be inverted similarly to the first modification.

The display device 1 is not limited to a liquid crystal display device and may be, for example, an organic EL display provided with organic light-emitting diodes (OLEDs) as the display elements. Alternatively, the display device 1 may be an inorganic EL display provided with inorganic light-emitting diodes (micro LEDs) as the display elements. Still alternatively, the display device 1 may be an electrophoretic display (EPD) or a transparent display that displays images on a transmissive display surface.

While the exemplary embodiments according to the present disclosure have been described, the embodiments are not intended to limit the present disclosure. The contents disclosed in the embodiments are given by way of example only, and various modifications may be made without departing from the spirit of the present disclosure. Appropriate modifications made without departing from the spirit of the present disclosure naturally fall within the technical scope of the present disclosure.

What is claimed is:
1. A display device comprising:
    a substrate having a display region in which a plurality of pixels are arrayed in a first direction and a second direction different from the first direction;
    a plurality of scanning lines coupled to the pixels arrayed in the first direction;
    a plurality of signal lines coupled to the pixels arrayed in the second direction;

a gate driver configured to supply a scanning signal to the scanning lines; and a signal line selection circuit configured to supply a pixel signal to the signal lines, wherein the gate driver comprises:

a shift register circuit comprising a plurality of register circuits cascaded in descending or ascending order in the second direction, the register circuits being configured to output a binary signal that maintains a high potential of an input signal at a rising edge of a shift clock signal until a falling edge of the shift clock signal; and a plurality of output circuits provided corresponding to the respective register circuits, the output circuits each include Q AND circuits configured to generate a logical product of an output signal of the register circuit and an enable signal as a logical value of the scanning signal, the register circuits each receive the shift clock signal that is at a high potential for Q+1 horizontal periods in descending or ascending order in a manner shifted by Q horizontal periods, and the Q AND circuits each receive the enable signal that is at a high potential for two horizontal periods in descending or ascending order in a manner shifted by one horizontal period.

2. The display device according to claim 1, wherein the scanning signal that is at a high potential for two horizontal periods is supplied to the scanning lines arrayed in the second direction in descending or ascending order in a manner shifted by one horizontal period, and the signal line selection circuit time-divides one horizontal period that is a latter half of a scanning line selection period in which the scanning signal is at a high potential and sequentially supplies the pixel signal to the pixels coupled to a selected scanning line.

3. A display device comprising:

a substrate having a display region in which a plurality of pixels are arrayed in a first direction and a second direction different from the first direction;

a plurality of scanning lines coupled to the pixels arrayed in the first direction;

a plurality of signal lines coupled to the pixels arrayed in the second direction;

a gate driver configured to supply a scanning signal to the scanning lines; and a signal line selection circuit configured to supply a pixel signal to the signal lines, wherein the gate driver comprises:

a shift register circuit comprising a plurality of register circuits cascaded in descending or ascending order in the second direction, the register circuits being configured to output a binary signal that maintains a high potential of an input signal at a falling edge of a shift clock signal until a rising edge of the shift clock signal; and a plurality of output circuits provided corresponding to the respective register circuits, the output circuits each include Q AND circuits configured to generate a logical product of an output signal of the register circuit and an enable signal as a logical value of the scanning signal, the register circuits each receive the shift clock signal that is at a low potential for Q+1 horizontal periods in descending or ascending order in a manner shifted by Q horizontal periods, and the Q AND circuits each receive the enable signal that is at a high potential for two horizontal periods in descending or ascending order in a manner shifted by one horizontal period.

* * * * *